United States Patent
Augusto et al.

(10) Patent No.: US 7,319,423 B2
(45) Date of Patent: Jan. 15, 2008

(54) MULTI-MODE ADC AND ITS APPLICATION TO CMOS IMAGE SENSORS

(75) Inventors: Carlos J. R. P. Augusto, San Jose, CA (US); Pedro N. C. Diniz, Cerritos, CA (US)

(73) Assignee: Quantum Semiconductor LLC, San Jose, CA (US)

( * ) Notice: Subject to any disclaimer, the term of this patent is extended or adjusted under 35 U.S.C. 154(b) by 0 days.

(21) Appl. No.: 11/418,119

(22) Filed: May 5, 2006

(65) Prior Publication Data

US 2006/0261996 A1    Nov. 23, 2006

Related U.S. Application Data

(63) Continuation-in-part of application No. 10/522,805, filed on Aug. 19, 2005, now Pat. No. 7,068,206.

(51) Int. Cl.
*H03M 1/12*    (2006.01)

(52) U.S. Cl. .................. 341/155; 341/118; 341/120; 341/150; 341/158; 341/159; 250/208.1; 250/214 A; 348/308

(58) Field of Classification Search ............... 341/155
See application file for complete search history.

(56) References Cited

U.S. PATENT DOCUMENTS

| | | |
|---|---|---|
| 5,479,103 A | 12/1995 | Grant et al. |
| 5,729,232 A | 3/1998 | Fujimori |
| 5,748,134 A | 5/1998 | Dent |
| 5,841,310 A | 11/1998 | Kalthoff et al. |
| 5,877,715 A * | 3/1999 | Gowda et al. .............. 341/122 |
| 5,920,274 A * | 7/1999 | Gowda et al. .............. 341/155 |
| 6,124,819 A | 9/2000 | Zhou et al. |
| 6,340,945 B1 | 1/2002 | Hauptmann et al. |
| 6,344,877 B1 * | 2/2002 | Gowda et al. .............. 348/245 |
| 6,366,231 B1 | 4/2002 | Harrison et al. |
| 6,448,911 B1 | 9/2002 | Somayajula |
| 6,720,896 B2 * | 4/2004 | Semmler et al. ............ 341/120 |
| 6,731,232 B1 * | 5/2004 | Kearney ..................... 341/163 |
| 6,839,011 B1 | 1/2005 | Hong |
| 6,963,300 B1 | 11/2005 | Lee |
| 6,972,705 B1 | 12/2005 | Fei et al. |

FOREIGN PATENT DOCUMENTS

GB      2 319 127      5/1998

* cited by examiner

*Primary Examiner*—Khai M. Nguyen
(74) *Attorney, Agent, or Firm*—Young & Thompson

(57) ABSTRACT

An analog-to-digital converter apparatus for analog source signals of one polarity, includes one comparator formed from transistors, a block of digitally addressable voltage sources to set a reference voltage of the comparator, an asynchronous n-bit digital counter, a block of digitally addressable voltage sources to set the potential to be applied to the signal source, a digital control unit, a block storing the calibration data for an input capacitor of the comparator, and a base-2 multiplier block, being interconnected by lines, including a line connecting the input analog signal to the drain of a pass transistor, a line connecting the block of voltage sources to be connected to the signal source, a line connecting the digital control unit to transistor gates, and a line carrying the signal Vref from the block of digitally addressed voltage sources to the comparator.

16 Claims, 11 Drawing Sheets

MULTI-MODE ADC AND ITS APPLICATION TO CMOS IMAGE SENSORS

Figure 1:
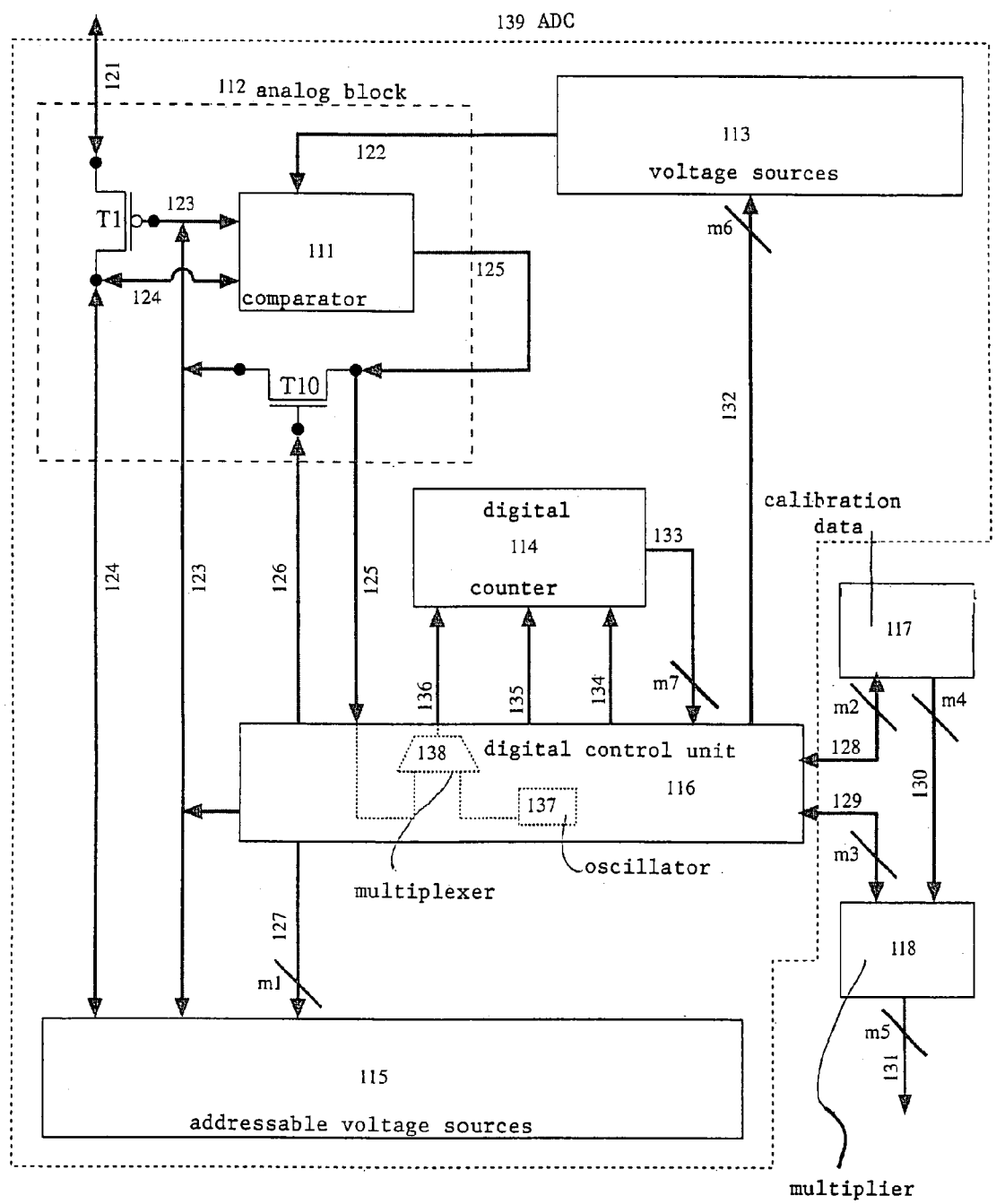

The present application is a continuation-in-part application of application, Ser. No. 10/522,805, filed Aug. 19, 2005 and issued as U.S. Pat. No. 7,068,206, dated Jun. 27, 2006.

FIELD OF THE INVENTION

The present invention relates to analog-to-digital conversion (ADC) of electrical signals in general. In particular it relates to the "acquisition and transfer circuitry" associated with a CMOS-based image sensor, comprising a matrix of avalanche pixels, conceived to complement an "Avalanche Pixel", consisting of at least one avalanche photo-diode (APD) and at least one transistor, the row-select transistor (RST).

BACKGROUND OF THE INVENTION application Ser. No. 10/522,805 describes a methodology for performing analog-to-digital conversion and a few possible circuit implementations of said methodology. Said methodology can be implemented with two modes: "Charge-to-Frequency" or "Charge-Subtraction", and "Voltage-to-Time" or "Voltage-Extrapolation", and is characterized by:

(a) The input of the ADC is connected to the source signal (Vin(t)), without "Sample and Hold" (S&H) capacitors interposed, therefore being exposed to variations of the source signal, without time integration;

(b) The analog and digital components through which the source signal (Vin(t)) is processed to generate the binary stream, and also those components implementing a feedback loop from the output to the input of the comparator, are all controlled and/or monitored asynchronously;

(c) The output of the comparator, is connected to an asynchronous n-bit digital counter thereby asynchronously registering changes of the state of the output of the comparator;

(d) A feedback loop between the output and the input of the comparator, is routed through an asynchronous path of a digital control unit, thereby enabling asynchronous resetting of the input components;

(f) Because of (a), (b), (c), and (d), the process of generating a stream of binary data at the output of the digital counter is entirely asynchronous on whether a source signal (Vin(t)) exists, and is larger than a voltage reference (Vref), which is itself programmable;

(g) Managed bandwidth, balancing the speed of conversion and the number of bits, through the programmability of the voltage reference (Vref) controlled by a digital controller unit;

The present invention describes a new implementation of the methodology introduced in application Ser. No. 10/522,805, resulting in more compact circuitry, capable of operating in multiple modes. The versatility of the new ADC will be applied to CMOS image sensors comprising a matrix with avalanche pixels, resulting in novel capabilities for image sensing and formation.

SUMMARY OF THE INVENTION

A first object of the present invention is a new implementation of the quantization methodology for analog signals of one polarity, comprising one comparator 111, pass transistors T1 & T10, a block of digitally addressable voltage sources 113 to set the reference voltage (Vref) of the comparator 111, asynchronous n-bit digital counter 114, a block of digitally addressable voltage sources 115 to set the potential to be applied to the signal source, a digital control unit 116, a block 117 storing the calibration data for the input capacitor (Cref) of the comparator 111, and a base-2 multiplier block 118, with the following connecting lines:

A. A line 121 connects the input analog signal (source signal) to the drain of pass transistor T1.

B. A line 124 connects the source of T1 to the source of T3, and to the block of voltage sources 115 to be connected to the signal source.

C. A line 123 connects the digital control unit 116 to the gates of T1, T2, T3, T4, T7, and drain of T10.

D. A line 122 carries the signal Vref from the block of digitally addressed voltage sources 113 to the source of transistor T2 of the comparator 111.

E. A line 126 connects the digital control unit 116 to the gate of T10.

F. A line 125 connects the output of the comparator 111 to the digital control unit 116 and the source of T10.

G. A group of lines 127 connect the digital control unit 116 to the gates of the pass transistors in block of digitally addressable voltage sources 115 to set the potential to be applied to the signal source.

H. A group of lines 132 connect the digital control unit 116 to the gates of the pass transistors in the block of digitally addressable voltage sources 113 to set the signal Vref for the source of transistor T2 inside the comparator 111.

I. One or several lines 133 connect the output of the asynchronous n-bit digital counter 114 to the digital control unit 116.

J. One line 134 connects the digital control unit 116 to the asynchronous n-bit digital counter 114, to provide a "Reset" signal.

K. One line 135 connects the digital control unit 116 to the asynchronous n-bit digital counter 114, to provide an "Enable" signal.

L. One line 136 connects the digital control unit 116 to the input of the asynchronous n-bit digital counter 114, to provide said input with either the output signal 125 of the comparator 111, or an oscillating signal, such as that provided by a "ring oscillator" 137.

M. One or several lines 128 connect the digital control unit 116 to the block 117 storing the calibration data for the input capacitor (Cref) of the comparator 111.

N. One or several lines 129 connect the digital control unit to the 116 to the base-2 multiplier 118.

O. One or several lines 130 connect the block 117 storing the calibration data for the capacitor Cref, to the base-2 multiplier 118.

P. A group of lines 131 provides access to the output of the base-2 multiplier 118, that is, to the binary value corresponding to the analog input signal.

A second object of the present invention is a new implementation of the quantization methodology for analog signals of both polarities, comprising two comparators 111+ & 111−, four pass transistors (T1+, T1−, T10+ & T10−), two blocks of digitally addressable voltage sources 113+ & 113− to set the reference voltages Vref+ & Vref− respectively of the comparators 111+ & 111−, two asynchronous n-bit digital counters (114+ & 114−), two blocks of digitally addressable voltage sources (115+ & 115−) to set the potential to be applied to the signal source, a digital control unit 116, two blocks (117+ & 117−) storing the calibration data for the input capacitors Cref+ & Cref− respectively of the comparators (111+ & 111−), and two base-2 multiplier blocks (118+ & 118−), with the following connecting lines:

A. Line 121+ (121−) connects the source signal to the drain of pass transistor T1+ (T1−);

B. Line 124+ (124−) connects the source of T1+ (T1−) to the source of T3+ (T3−), and to the block of voltage sources 115+ (115−) to be connected to the signal source;

C. Line 123+ (123−) connects the digital control unit 116 to the gates of T1+ (T1−), T2+ (T2−), T3+ (T3−), T4+ (T4−), T7+ (T7−), and drain of T10+ (T10−);

D. Line 122+ (122−) carries the signal Vref+ (Vref−) from the block of digitally addressed voltage sources 113+ (113−) to the source of transistor T2+ (T2−) of the comparator 111+ (111−);

E. Line 126+ (126−) connects the digital control unit 116+ (116−) to the gate of T10+ (T10−); line 125+ (125−) connects the output of the comparator 111+ (111−) to the digital control unit 116 and the source of T10+ (T10−);

F. A group of lines 127+ (127−) connect the digital control unit 116 to the gates of the pass transistors in block of digitally addressable voltage sources 115+ (115−) to set the potential to be applied to the signal source;

G. Group of lines 132+ (132−) connect the digital control unit 116 to the gates of the pass transistors in the block of digitally addressable voltage sources 113+ (113−) to set the signal Vref+ (Vref−) for the source of transistor T2+ (T2−) inside the comparator 111+ (111−);

H. One or several lines 133+ (133−) connect the output of the asynchronous n-bit digital counter 114+ (114−) to the digital control unit 116;

I. One line 134+ (134−) connects the digital control unit 116 to the asynchronous n-bit digital counter 114+ (114−), to provide a "Reset" signal;

J. One line 135+ (135−) connects the digital control unit 116 to the asynchronous n-bit digital counter 114+ (114−), to provide an "Enable" signal;

K. One line 136+ (136−) connects the digital control unit 116 to the input of the asynchronous n-bit digital counter 114+ (114−), to provide said input with either the output signal 125+ (125−) of the comparator 111+ (111−), or an oscillating signal, such as that provided by a "ring oscillator" 137;

L. One or several lines 128+ (128−) connect the digital control unit 116 to the block 117+ (117−) storing the calibration data for the input capacitor Cref+ (Cref−) of the comparator 111+ (111−);

M. One or several lines 129+ (129−) connect the digital control unit to the 116 to the base-2 multiplier 118+ (118−);

N. One or several lines 130+ (130−) connect the block 117+ (117−) storing the calibration data for the capacitor Cref+ (Cref−), to the base-2 multiplier 118+ (118−);

O. One or several output lines 131 provide the unified binary data stream, combining the binary streams generated by blocks 118+ & 118−.

A third object of the present invention is an ADC based on the implementation of the first object of the present invention, in which block 118 is not part of one single ADC, but is shared by several ADCs operating in parallel, and in which block 117 is part of a table or array of such blocks from several ADCs operating in parallel, all under digital control.

A fourth object of the present invention is an ADC based on the implementation of the second object of the present invention, in which blocks 118+ & 118− are not part of one single ADC, but are shared by several ADCs operating in parallel, and in which blocks 117+ & 117− are part of a table or array of such blocks from several ADCs operating in parallel, all under digital control.

A fifth object of the present invention is a method of analog to digital conversion using the ADC of the first, or second, or third, or fourth objects of the present invention, operating in a "charge-to-frequency" or "charge-subtraction" mode, in which the input capacitor Cref of the comparator 111 is used to subtract a set of charges from the signal source, and the asynchronous n-bit digital counter 114 records how many sets of charges are subtracted, the method comprising the steps of:

A. Initialization by resetting/pre-loading of comparator: the digital control unit 116 commands through line 123 the gates of T1 and T3 to be turned OFF, while the gates of T2 and T4 are turned ON, thereby pre-loading the capacitor Cref with the value Vref, B. Quantization operation begins with the digital control unit 116 turning ON transistor T11, C. The digital control unit 116 turns OFF all voltage sources that are controlled by lines 127, D. The digital control unit 116 sets line 123 to a state such that the gate of T1, T2, T3 and T4 follow the output 125 of the comparator 111. When this happens, T1 and T3 are turned ON, while T2 and T4 are turned OFF.

E. With T1 and T3 turned ON, if the source signal is larger than the value Vref that the capacitor Cref was pre-loaded with, there will be a transition at the output 125 of the comparator 111.

F. A transition a the output 125 of the comparator 111, while T10 is ON, turns T1 & T3 OFF and turns T2 & T4 ON, thereby re-loading (resetting) the capacitor Cref with the value Vref.

G. Once Cref is re-loaded with Vref, the output 125 of the comparator 111 experiences another transition, thereby initiating another quantization cycle in which another set of charges are removed by the capacitor Cref from the signal source.

H. The digital counter 114 records the number of transitions occurring at the output 125 of the comparator 111, I. When the digital control unit 116 senses that the output 125 of the comparator is no longer experiencing transitions, or when an external control signal commands it, the quantization process is declared complete, and the digital control unit 116 retrieves the value recorded by the digital counter 114, and makes it available at the output of the ADC 137.

A sixth object of the present invention is a method of analog to digital conversion using the ADC of the first, or second, or third, or fourth objects of the present invention, operating in a "voltage-to-time" or "voltage extrapolation" mode, in which the input capacitor Cref of the comparator 111 is exposed to the source signal, and from its partial charging an extrapolation is made about the actual value of the source signal, the method comprising the steps of:

A. The digital control unit 116 turning OFF transistor T10,

B. The digital control unit 116, through lines 132, selects the source with the lowest value of Vref.

C. Initialization by resetting/pre-loading of comparator: the digital control unit 116 commands through line 123 the gates of T1 and T3 to be turned OFF, while the gates of T2 and T4 are turned ON, thereby pre-loading the capacitor Cref with the value Vref, D. The digital control unit 116, through lines 127, turns ON the voltage source inside block 115 connected to the largest voltage presumed to elicit a linear response from the signal source, E. The digital control unit 116 turns ON transistors T1 & T3, which at the same time turns OFF transistors T2 & T4, thereby exposing the capacitor Cref to the source signal, F. Simultaneously trigger the digital counter 114 to count time, by feeding its input with an oscillatory signal with a known and well defined time period, G. If/when the source signal is/becomes larger than the value Vref, which Cref was preloaded with, there is a transition at the output 125 of the comparator 111, H. When the digital control unit 116 senses a transition at the output 125 of the comparator 111, it stops the digital counter 114, I. If the value registered by the digital counter 114 is judged to be too small?

If "Yes", repeat the sequence of steps from (B) to (H), with a larger Vref being selected at step (B). If the value registered by the digital counter 114 is judged to be too small, even with the largest Vref possible, then the sequence of steps from (B) to (H) should be repeated with, having selected the largest Vref at step (B), and at step (D) selecting inside block 115 the voltage source with the value that is immediately below the was previously chosen.

If "No", go to next step.

K. The digital control unit 116 reads out the value registered by the digital counter 114, sends the value to the base-2 digital multiplier 118, commands block 117 to send the stored calibration data of capacitor Cref to the base-2 multiplier 118

L. Base-2 multiplier computes, using the extrapolation algorithm, the actual value of source signal from the value registered by the digital counter 114 and from the calibration data of Cref 117, M. Transfer of the computed value by the base-2 multiplier 118 to an external storage block, such as a data table.

N. Repeat steps (B) through (M) for any further quantization processes of the source signal.

A seventh object of the present invention is a method of analog to digital conversion using the ADC of the first, or second, or third, or fourth, objects of the present invention, in which the mode of operation can be software-configured in real-time, between "Charge-Subtraction" and "Voltage-Extrapolation" of the third and forth objects of the present invention, depending on the conditions of the analog input signal (source signal) itself, or on some external control signal.

An eighth object of the present invention is an image sensing system, in which the ADC of the third object of the present invention is used as column circuitry ("Column ADC") 143 and 144 of a CMOS image sensor comprising a matrix of avalanche pixels 140, each comprising one avalanche photo-diode (APD) and one Row-Select Transistor (RST), fabricated according to U.S. Pat. No. 6,943,051 B2, and with layouts such as those described in PCT/EP2005/008182 (filed in 28 Jul. 2005), a matrix controller 141 as well as a logic unit comprising a run length encoder 142, table 145 with Cref calibration data for ADCs of blocks 143 & 144, one or more base-2 multiplier 146, a timing table 147 for 3D imaging, and a number n of bit planes 148*a* to 148*n*, to be used in the Sub-Frame method of image formation.

A ninth object of the present invention is a process for image acquisition and readout using the imaging sensing system of the eighth object, in which the method of analog to digital conversion of the fifth object is used to readout the light intensity signal from each pixel, when the pixel matrix is operated in a "Global Shutter" mode, comprising the following steps:

1. Signal Acquisition (Described in the Fluxogram of FIG. 6)

1A. Pre-definition of "integration time" or "shutter window" for all pixels in the sensor matrix.

1B. Pixels absorb light and store charge during the "integration time", simultaneously for the entire sensor matrix. The "integration time" is set by the width of a voltage pulse that is applied to all photo-diodes in parallel, and whose amplitude defines the avalanche gain. The voltage pulse in question is applied to the terminal that is common to all photo-diodes in the sensor matrix, and which is not shown in the Figures.

2. Readout Process (Described in the Fluxogram of FIG. 7)

2A. Selection of N-Row

2B. Enable direct interaction between "charge reservoir" (capacitor) inside the pixel of selected row and the ADC. The ADC will be operating in the "Charge-Subtraction" mode, in which it subtracts a pre-defined amount of charge from the pixel, and counts how many times that pre-defined amount of charge was subtracted from the pixel. The amount of charge to be subtracted can be modified through software control.

2C. The time interval during which there is a direct interaction between a pixel and the ADC is software-programmable.

2D. When the pre-defined time interval for direct interaction between a pixel and the ADC is exhausted, there is de-selection of N-Row, and selection of another Row (e.g., N+1).

3. The entire process from 2A to 2D is repeated until all rows have been selected and all pixels have interacted with the ADC.

A tenth object of the present invention is a process for image acquisition and readout using the imaging sensing system of the eighth object, in which the method of analog to digital conversion of the sixth object is used to readout the light intensity signal from each pixel, when the pixel matrix is operated in a "Rolling Shutter" mode, comprising the following steps:

The Data Acquisition & Readout Process is as Follows (Described in the Fluxogram of FIG. 8):

1. Selection of N-Row.

2. From the ADC, apply maximum voltage setting to the bottom terminal of the APD.

3. Verify that there is no current saturation (linear avalanche mode).

4. If there is current saturation, select the voltage level immediately below the one just used.

5. Repeat C & D, until there is no saturation of avalanche current.

6. Measure voltage drop with ADC operating in "Voltage-Extrapolation" mode.

7. De-selection of N-Row.

8. Selection of (N+1)-Row.

Repeat steps 2 through 8 until all rows have been read.

An eleventh object of the present invention is a process for image acquisition and readout using the imaging sensing system of the eighth object, in which the method of analog to digital conversion of the sixth object is used to readout the timed edge/pulse signal from each pixel, when the pixel matrix is operated in a "Rolling Shutter" mode, comprising the following steps:

The Data Acquisition & Readout Process is as Follows (Described in the Fluxopgram of FIG. 9):
1. The N-Row is selected.
2. Photons are emitted from the point of observation.
3. "Column counters" start counting time.
4. When the APD of a given pixel generates a large photo-current, it stops the respective column counter.
5. De-selection of N-Row, and selection of another Row (e.g., N+1).
   Repeat steps 2 through 8 until all rows have been read.

A twelfth object of the present invention is a new process for image acquisition and readout using the imaging sensing system of the eighth object, in which the method of analog to digital conversion of the fifth object is used to readout the signal from each pixel, simultaneously with the entire pixel matrix absorbing light, thereby having the entire imaging system operating in a "Shutter-less" mode, comprising the following steps:
1. Light can be absorbed, all the time (shutter-less), by all pixels in the sensor matrix.
2. Readout is continuously performed (row by row) for all pixels of the sensor matrix.
3. Selection of N-Row for a pre-determined amount of time. (This "Readout Window" should not to be confused with "Shutter Window").
4. During the "Readout Window", in each column a single pixel interacts directly with the column ADC in the "Charge-Subtraction" mode, and the "Readout Window" limits the maximum number of "packets of charge" that can be subtracted by the ADC from the charge reservoir inside the pixel.
5. Each "packet of charge" that is subtracted from the charge reservoir inside a pixel, causes a change of state at the output of the ADC, which in turn drives the n-bit digital counter asynchronously.
6. The "Readout Window" is software-programmable, and the end of a "Readout Window" leads to the selection of another Row (e.g., N+1), and readout of the respective pixels.

A thirteenth object of the present invention is a new method of image formation, the "Full-Frame" method of "Sequence A", utilizing the image sensing system of the eighth object of the present invention, and comprising the following steps:

First-Phase—"Accumulation of Charges"

Operation 1. Accumulate Charges in Pixels for All Rows of the Pixel Matrix
1A. Define "Electronic Global Shutter" window (integration time).
1B. All rows are de-selected (all RSTs are OFF).
1C. Apply negative voltage pulse at the common top electrode of the APDs. The pulse width (duration of the pulse) defines the shutter window.

Second Phase—Row-by-Row Readout of Accumulated Charges+ Measurement of Photo-Current with Linear Gain+ Edge/Pulse Detection for Geiger mode For each row of the pixel matrix perform the following operations.

Operation 2. Readout of Accumulated Charges in Pixels of Row "N"
2A. Pre-select the ADC and digital counter in each column to operate in the charge-to-frequency mode, and define also the time interval available for readout.
2B. Select Row "N" (turn on all RSTs in Row "N"), to begin the interaction between "charge reservoirs" and "ADC+ Counter".
2C. At the end of the pre-defined readout time, move data from counters to row "N" of "First-Table".

Operation 3. Measure Photo-Current (Linear Gain) in Pixels of Row "N"
3A. Pre-select the ADC and digital counter in each column to operate in the voltage-to-time mode.
3B. Select Row "N" (turn ON all RSTs in Row "N").
3C. Apply suitable voltage to APD for measuring photo-current:
   3C1. Apply negative potential at the top electrode (shared by all APDs). The pixels with RSTs turned OFF have an applied voltage whose magnitude is equal or less than the magnitude of this negative potential, which is not enough to provide avalanche conditions.
   3C2. Apply positive potential at the column readout line. The APDs in the pixels with RSTs turned OFF are not affected by this positive potential.
   3C3. The APDs in pixels with RSTs turned ON, are under a total applied voltage that is the sum of the negative and positive potentials, which is chosen for its suitability to measure photo-current with large linear avalanche gain.
3D. Measure photo-current with column ADC operating in the voltage-to-time mode.
3E. Move data from counters to row "N" of "Second-Table".

Operation 4. Edge/Pulse Detection (Geiger) in Pixels of Row "N"
4A. Set ADC to measure Time-Of-Flight (TOF)
   4A1. Apply negative potential on top (common) terminal of all APDs (can be same as 3C1).
   4A2. Apply positive potential at the column line such that the voltage across the APDs of Row "N" is suitable for Geiger mode.
4B. Simultaneously do:
   4B1. Emit light pulse in the suitable range of wavelengths (e.g., Short Wavelength Infra-Red).
   4B2. Begin counting time using column "digital counter".
4C. Absorption of at least one photon induces a large current/voltage swing at the APD, which stops the column "digital counter".
4D. Move data from counters to "Third-Table".
4E. De-selection of Row "N"
   Repeat operations 2 through 4 for subsequent rows in turn.
   Merge data from "First-Table", "Second-Table" and "Third-Table", into a new table with a suitable format.

A fourteenth object of the present invention is a new method of image formation, a "Full-Frame" method of "Sequence B", utilizing the image sensing system of the eighth object of the present invention, and comprising the following steps:

First-Phase—"Accumulation of Charges"

Operation 1. Accumulate Charges in Pixels for All Rows of the Pixel Matrix
1A. Define "Electronic Global Shutter" window (integration time).
1B. All rows are de-selected (all RSTs are OFF).

1C. Apply negative voltage pulse at the common top electrode of the APDs. The pulse width (duration of the pulse) defines the shutter window.

Second Phase—Row-by-Row Readout of Accumulated Charges

For each row of the pixel matrix perform the following operations.

Operation 2. Readout of Accumulated Charges in Pixels of Row "N"

2A. Pre-select the ADC and digital counter in each column to operate in the charge-to-frequency mode, and define also the time interval available for readout.

2B. Select Row "N" (turn ON all RSTs in Row "N"), begin interaction between "charge reservoirs" and "ADC+ Counter".

2C. At the end of the pre-defined readout time, move data from counters to row "N" of "First-Table".

Repeat operation 2 for subsequent rows in turn.

Third Phase—Measurement of Photo-Current (Linear Gain)+Edge/Pulse Detection (Geiger mode)

For each row of the pixel matrix perform the following operations 3 and 4.

Operation 3. Measure Photo-Current (Linear Gain) in Pixels of Row "N"

3A. Pre-select the ADC and digital counter in each column to operate in the voltage-to-time mode.

3B. Select Row "N" (turn ON all RSTs in Row "N").

3C. Apply suitable voltage to APD for measuring photo-current:

3C1. Apply negative potential at the top electrode (shared by all APDs). The pixels with RSTs turned OFF have an applied voltage whose magnitude is equal or less than the magnitude of this negative potential, which is not enough to provide avalanche conditions.

3C2. Apply positive potential at the column readout line. The APDs in the pixels with RSTs turned OFF are not affected by this positive potential.

3C3. The APDs in pixels with RSTs turned ON, are under a total applied voltage that is the sum of the negative and positive potentials, which is chosen for its suitability to measure photo-current with large linear avalanche gain.

3D. Measure photo-current with column ADC working in the voltage-to-time mode.

3E. Move data from counters to row "N" of "Second-Table".

Operation 4. Edge/Pulse Detection (Geiger Mode) in Pixels of Row "N"

4A. Set APDs of Row "N" and ADC to operate in the "Edge/Pulse Detection" mode.

4A1. Apply negative potential common terminal of all APDs (can be same as 3C1).

4A2. Apply positive potential at the column line such that the voltage across the APDs of Row "N" is suitable for Geiger mode.

4B. Simultaneously do:

4B1. Emit light pulse in the suitable range of wavelengths (e.g., Short Wavelength Infra-Red).

4B2. Begin counting time using column "digital counter".

4C. Detection current step or pulse coming from APD, and stopping of column "digital counter".

4D. Move data from counters to row "N" of "Third-Table".

4E. De-selection of Row "N"

Repeat operation 2 and 4 for subsequent rows in turn.

Merge data from "First-Table", "Second-Table" and "Third-Table", into a new table with a suitable format.

A fifteenth object of the present invention is a new method of image formation, the "Full-Frame" method of "Sequence C", utilizing the image sensing system of the eighth object of the present invention, and comprising the following steps:

First Phase—"Accumulation of Charges"

Operation 1. Accumulate Charges in Pixels for All Rows of the Pixel Matrix

1A. Define "Electronic Global Shutter" window (integration time).

1B. All rows are de-selected (all RSTs are OFF).

1C. Apply negative voltage pulse at the common top electrode of the APDs. The pulse width (duration of the pulse) defines the shutter window.

Repeat operation 1 for subsequent rows in turn.

Second Phase—Readout of "Accumulated Charges" for all Rows

Operation 2. Readout of Accumulate Charges in Pixels for All Rows of the Pixel Matrix 2A. Pre-select the ADC and digital counter in each column to operate in the charge-to-frequency mode, and define also the time interval available for readout.

2B. Select Row "N" (turn ON all RSTs in Row "N"), begin interaction between "charge reservoirs" and "ADC+ Counter".

2C. At the end of the pre-defined readout time, move data from counters to row "N: of "First-Table".

Repeat operation 2 for subsequent rows in turn.

Third Phase—Measurement of Photo-Current (Linear Gain)

Operation 3. Measure Photo-Current (Linear Gain) in Pixels of Row "N"

3A. Pre-select the ADC and digital counter in each column to operate in the voltage-to-time mode.

3B. Select Row "N" (turn ON all RSTs in Row "N").

3C. Apply suitable voltage to APD for measuring photo-current:

3C1. Apply negative potential at the top electrode (shared by all APDs). The pixels with RSTs turned OFF have an applied voltage whose magnitude is equal or less than the magnitude of this negative potential, which is not enough to provide avalanche conditions.

3C2. Apply positive potential at the column readout line. The APDs in the pixels with RSTs turned OFF are not affected by this positive potential.

3C3. The APDs in pixels with RSTs turned ON, are under a total applied voltage that is the sum of the negative and positive potentials, which is chosen for its suitability to measure photo-current with large linear avalanche gain.

3D. Measure photo-current with column ADC working in the voltage-to-time mode.

3E. Move data from counters to row "N" of "Second-Table".

Repeat operation 3 for subsequent rows in turn.

Fourth Phase—Edge/Pulse Detection (Geiger mode)

Operation 4. Edge/Pulse Detection (Geiger Mode) in Pixels of Row "N"

4A. Set APDs of Row "N" and ADC to operate in the "Edge/Pulse Detection" mode.

4A1. Apply negative potential on top (common) terminal of all APDs (can be same as in 3C1).

4A2. Apply positive potential at the column line such that the voltage across the APDs of Row "N" is suitable for Geiger mode.

4B. Simultaneously do:
  4B1. Emit light pulse in the suitable range of wavelengths (e.g., Short Wavelength Infra-Red).
  4B2. Begin counting time using column "digital counter".
4C. Detection current step or pulse coming from APD, and stopping of column "digital counter".
4D. Move data from counters to row "N" of "Third-Table".
4E. De-selection of Row "N"
  Repeat operation 4 for subsequent rows in turn.
  Merge data from "First-Table", "Second-Table" and "Third-Table", into a new table with a suitable format.

A sixteenth object of the present invention is a new method of image formation, the "Sub-Frame" method, based on the "Shutter-less" process of image acquisition and readout of the ninth object of the present invention, and comprising the following steps:

First Phase—"Accumulation of Charges"
1. Light is absorbed in all pixels all the time (shutter-less).
2. All rows are de-selected (all RSTs are OFF)
3. Apply constant negative potential to top electrode of the APDs (shared by all APDS).

Second Phase—Readout of Row "N"
4. Pre-select column ADC and digital counters to operate in the charge-to-frequency mode. The time interval available for readout is suitable to subtract only one "packet of charges" from a pixel.
5. Turn ON all RSTs in Row "N", and begin interaction between "charge reservoirs" inside the pixels of Row "N", and column ADC & Counter.
6. At the end of the pre-defined readout time, move data from counters to a Table named "Sub-Frame_M".
7. Repeat Readout Sequence of Row "N" for all Rows.

BRIEF DESCRIPTION OF THE DRAWING FIGURES

Figure 2:
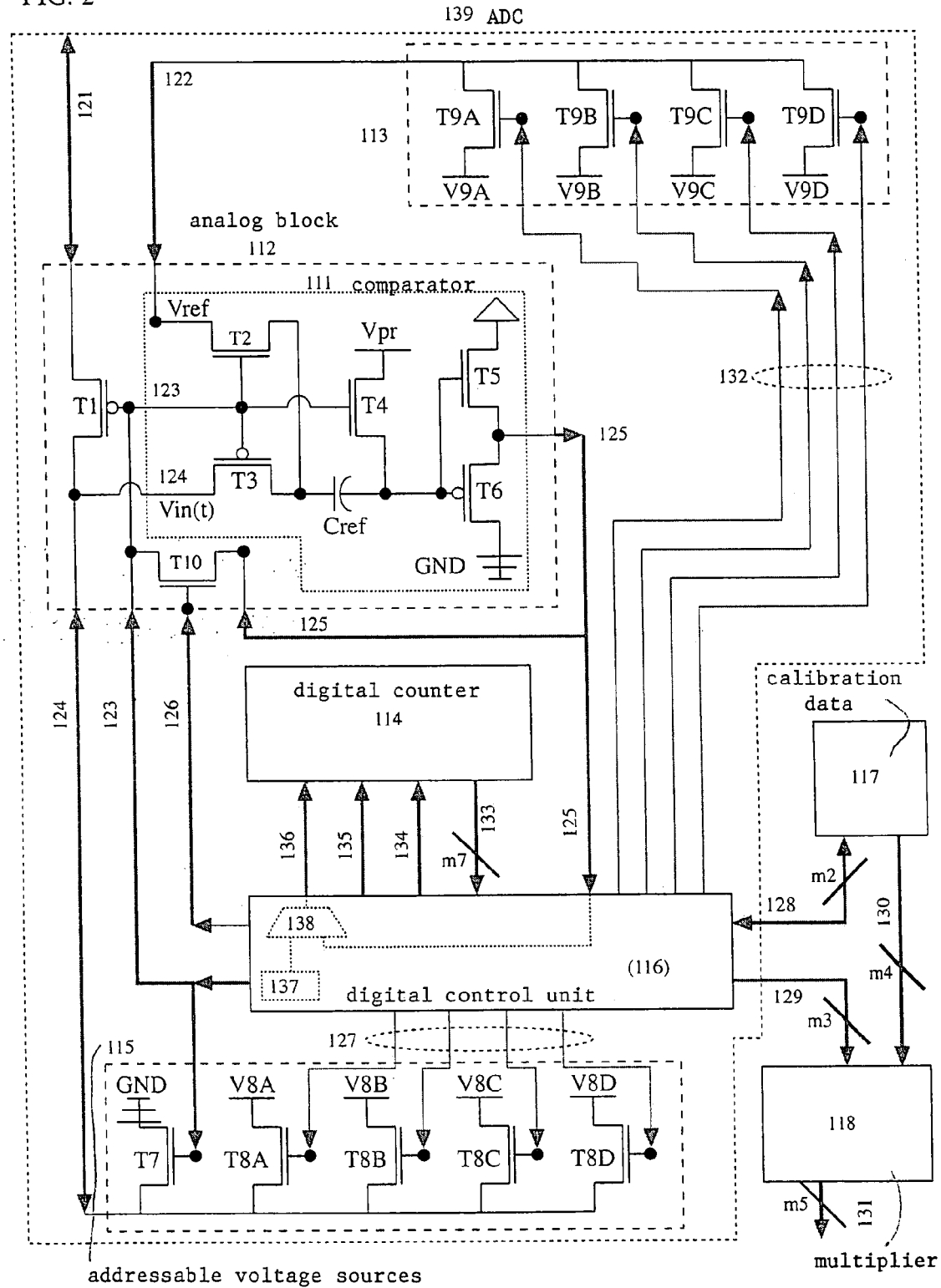
Figure 3:
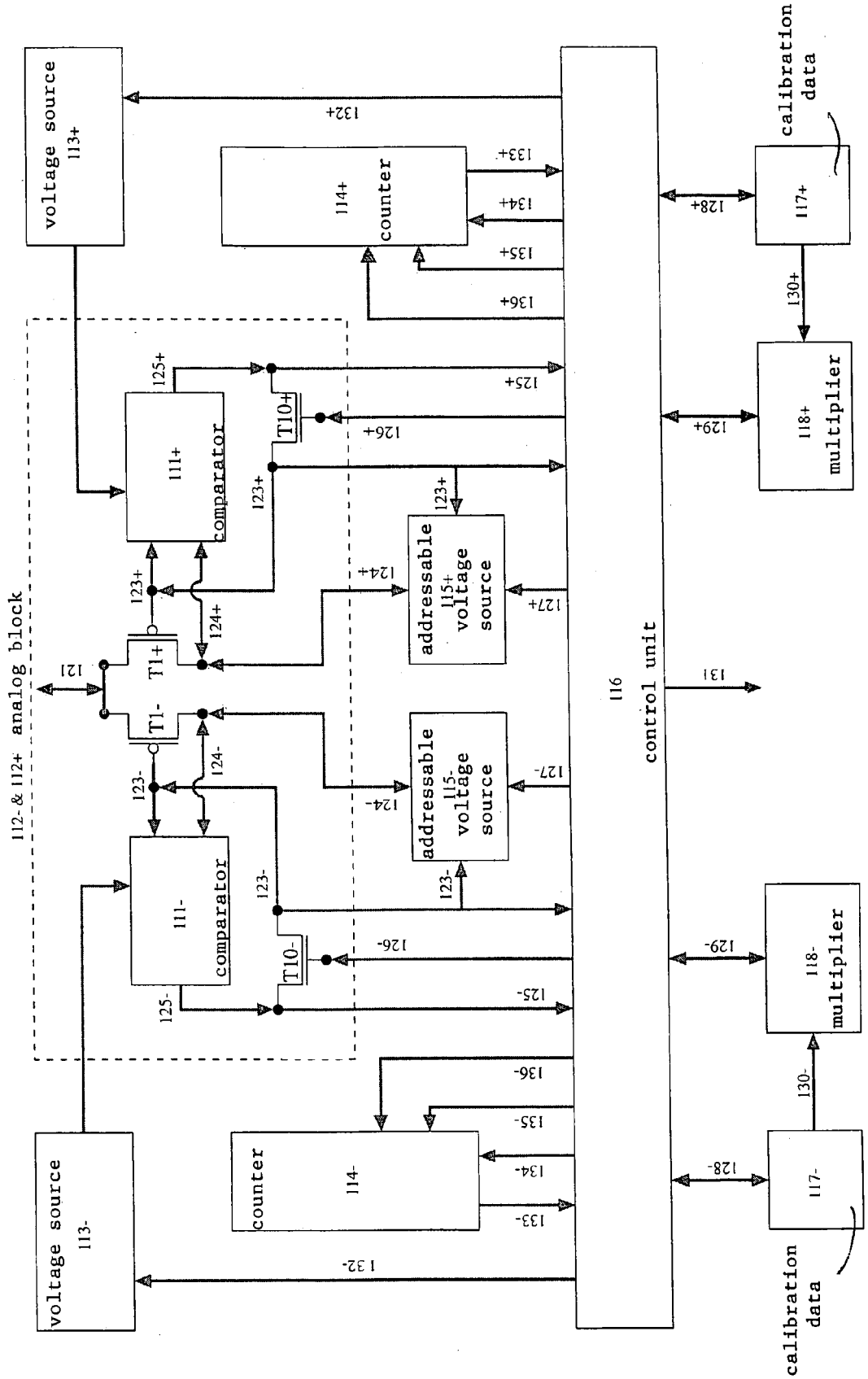
Figure 4:
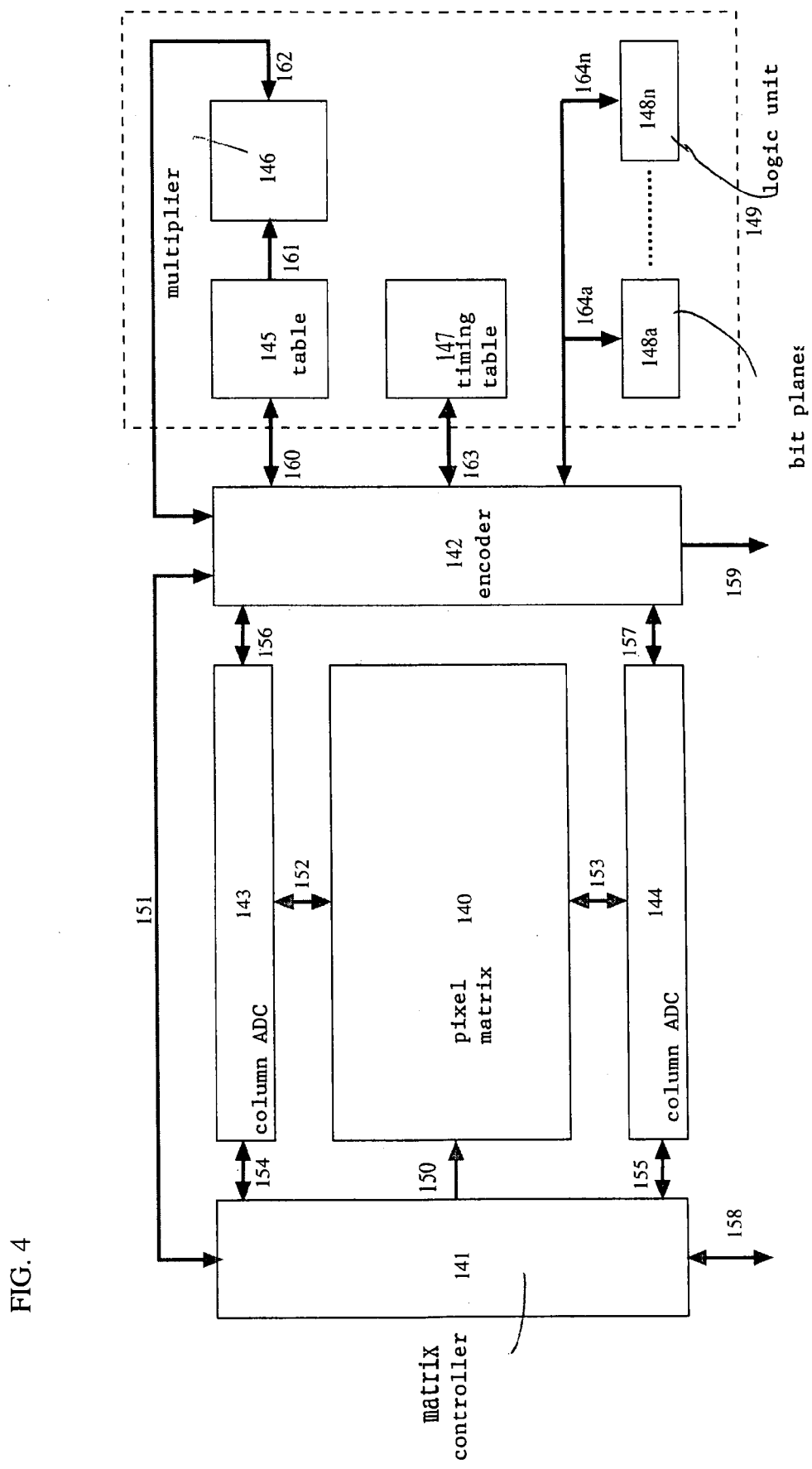
Figure 5:
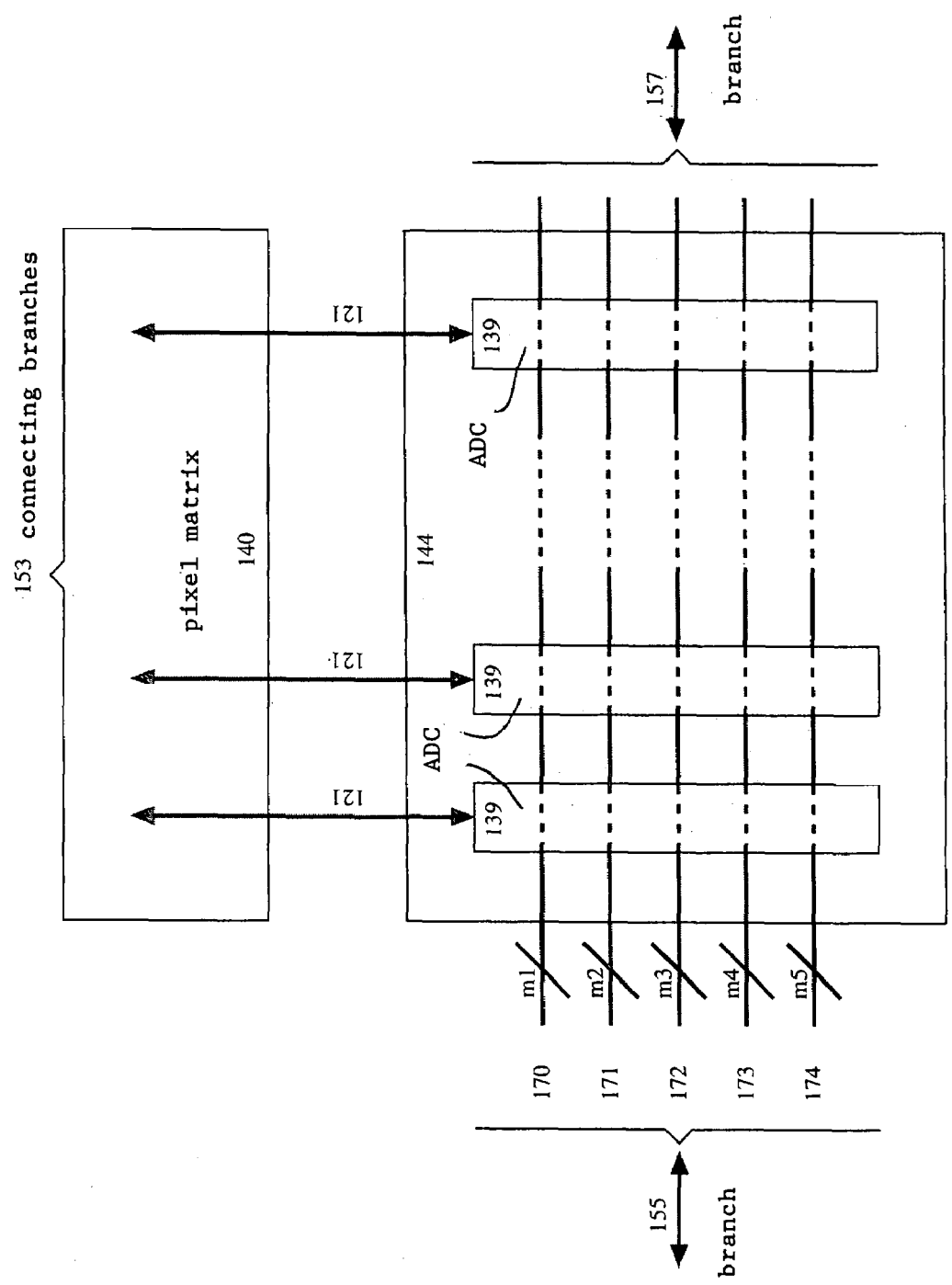
Figure 7:
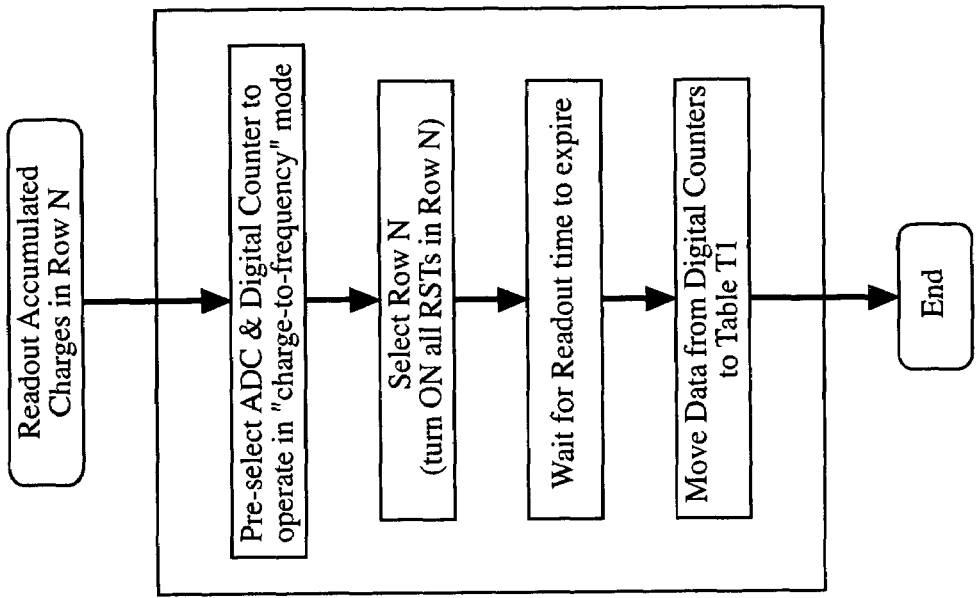
Figure 6:
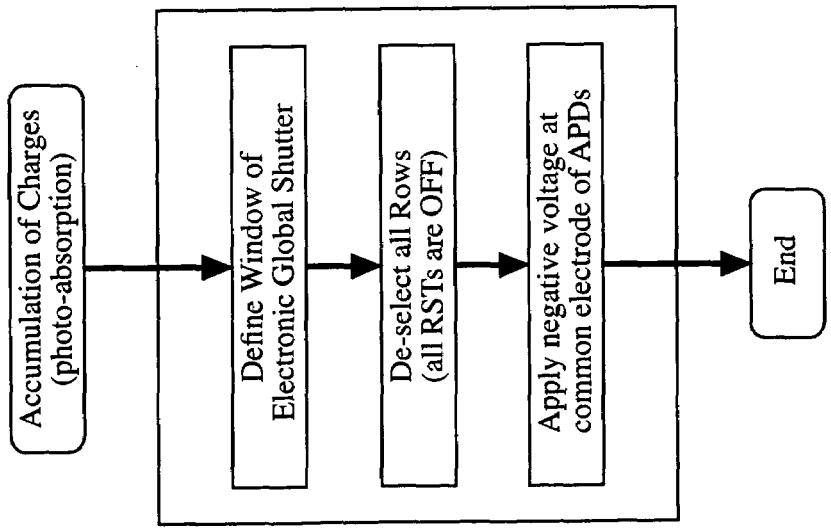
Figure 9:
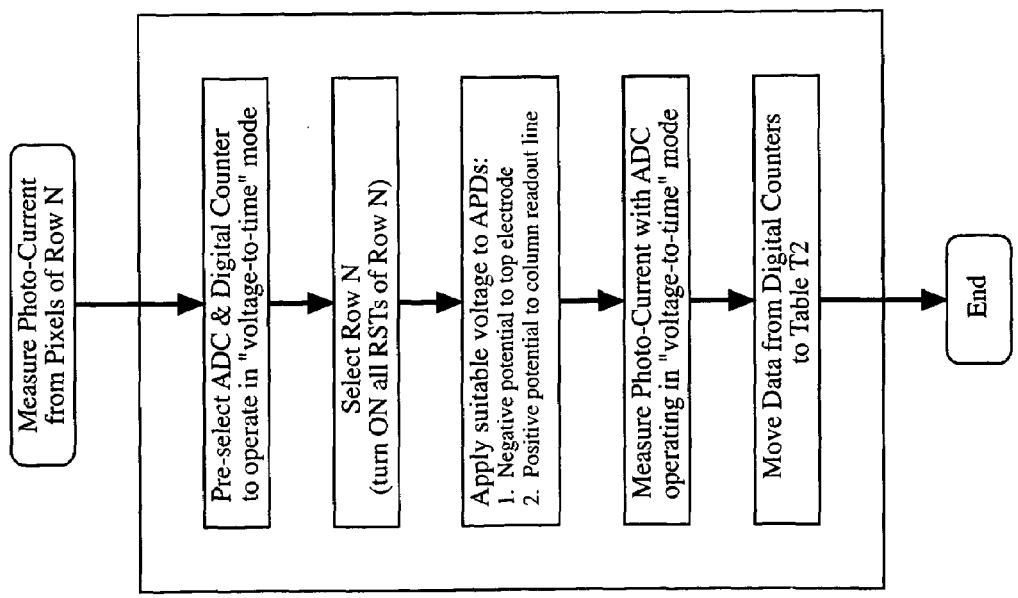
Figure 8:
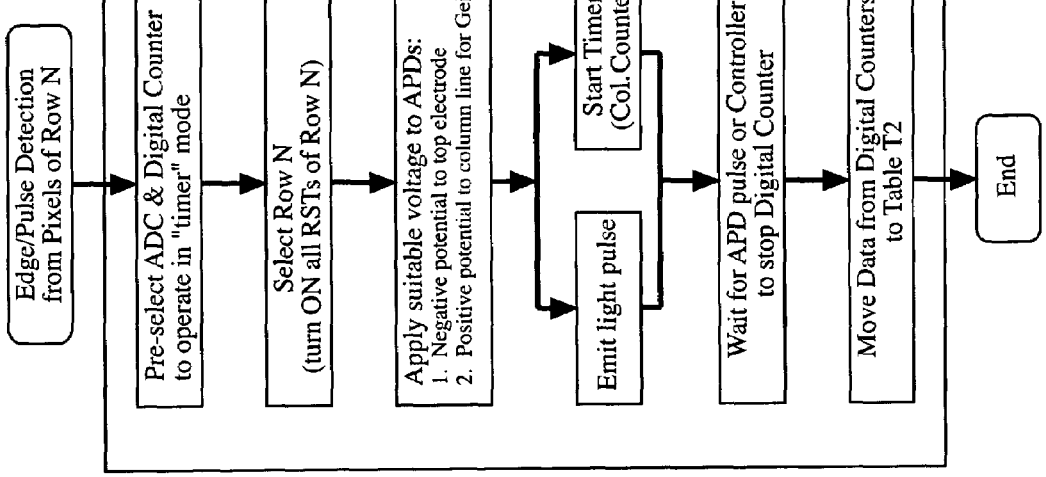
Figure 10:
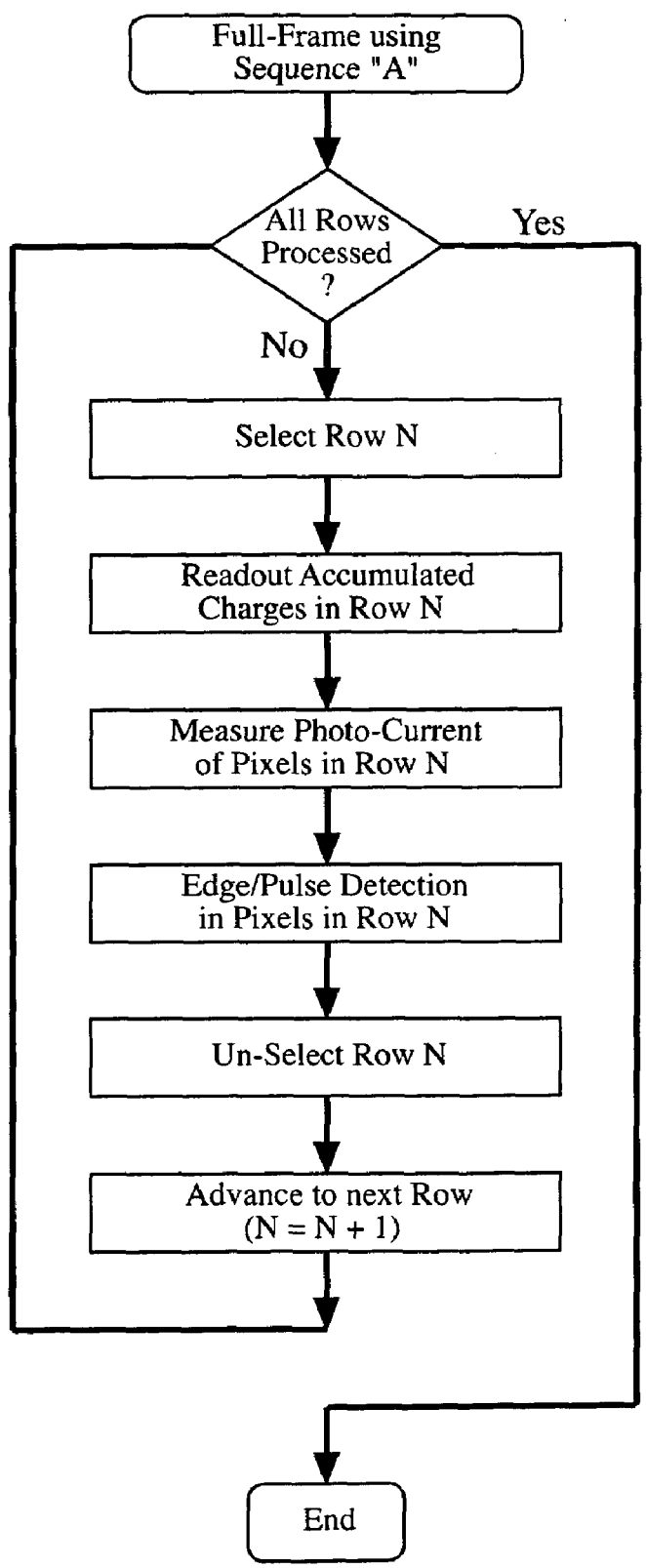
Figure 11:
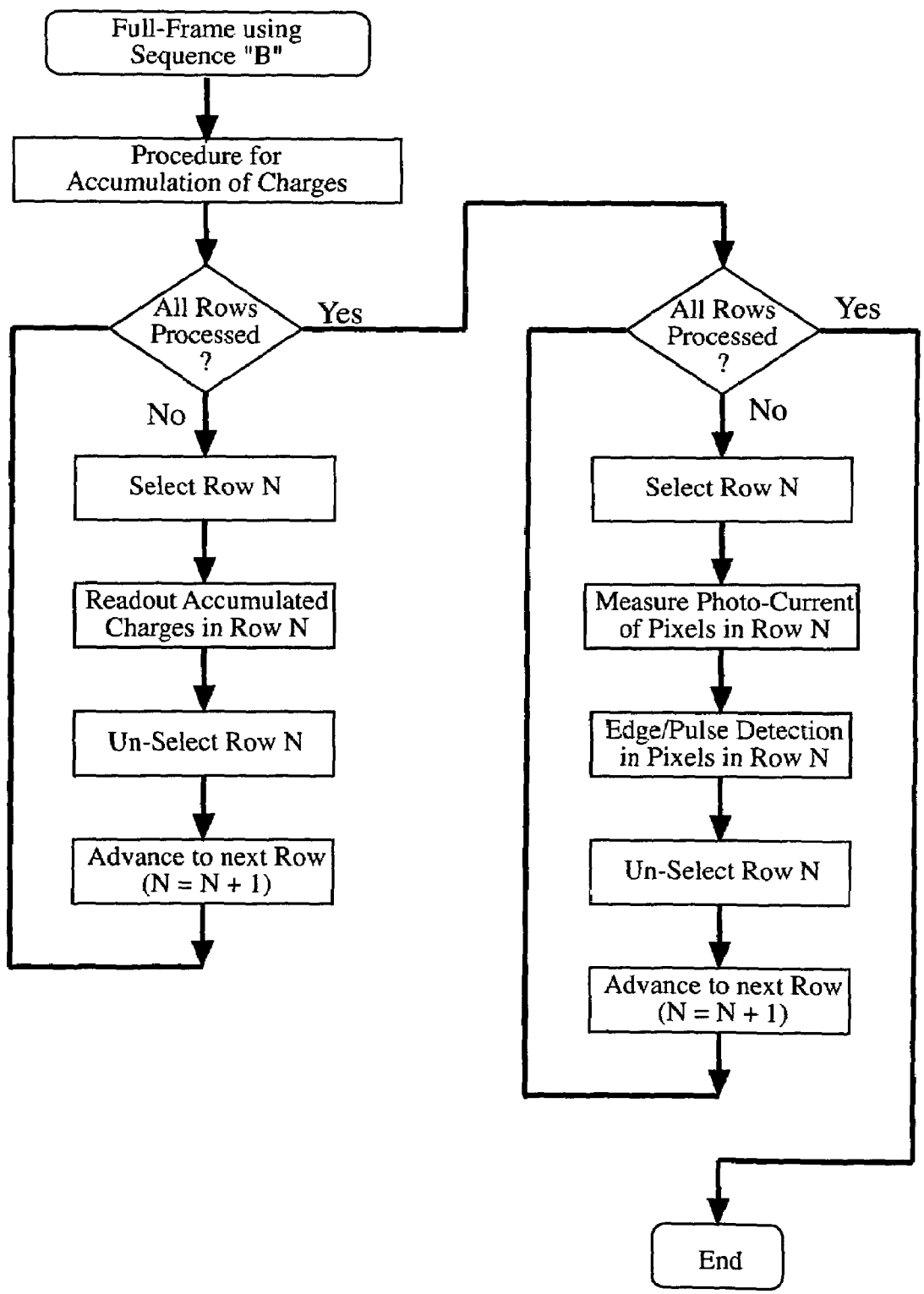
Figure 12:
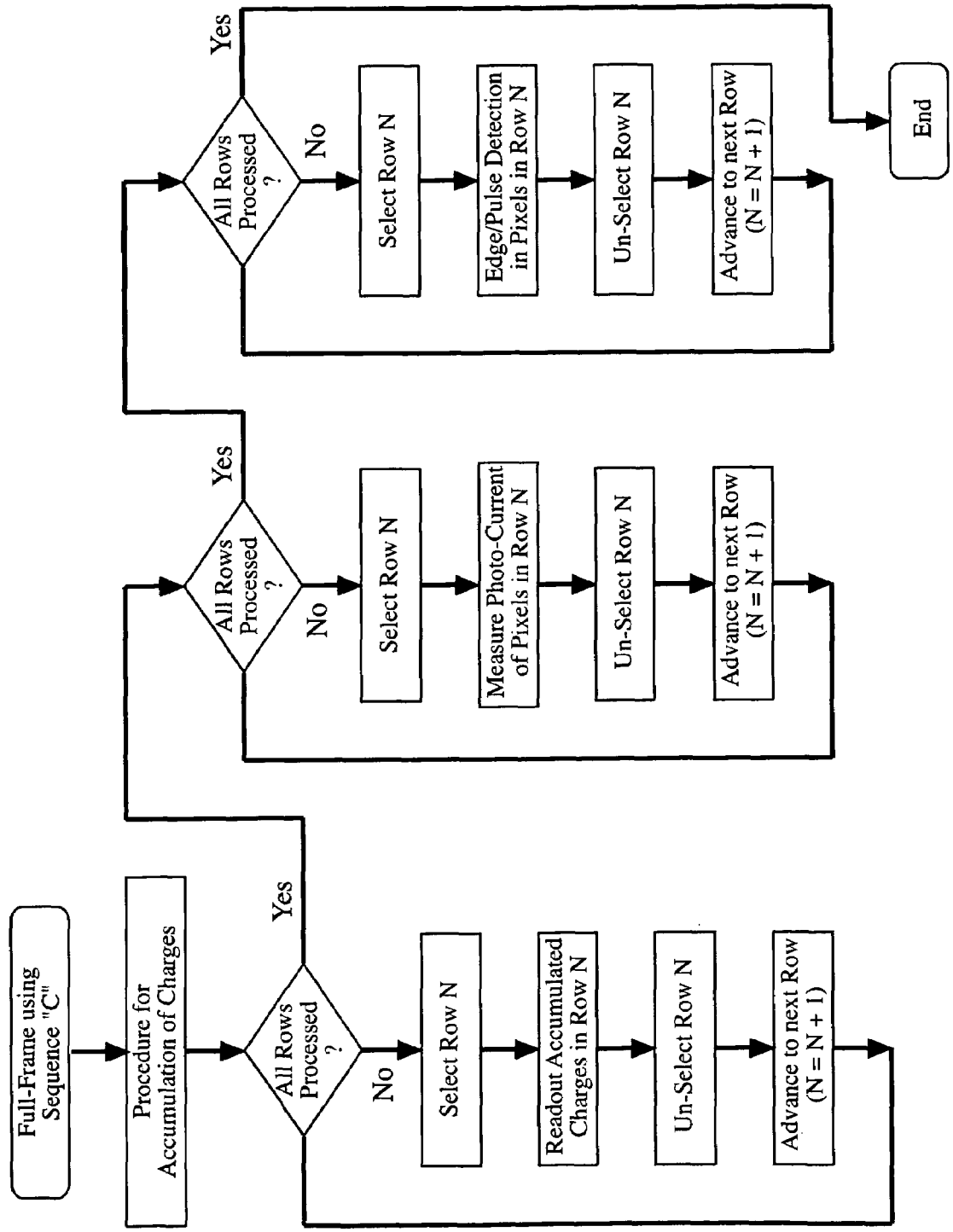
Figure 13:
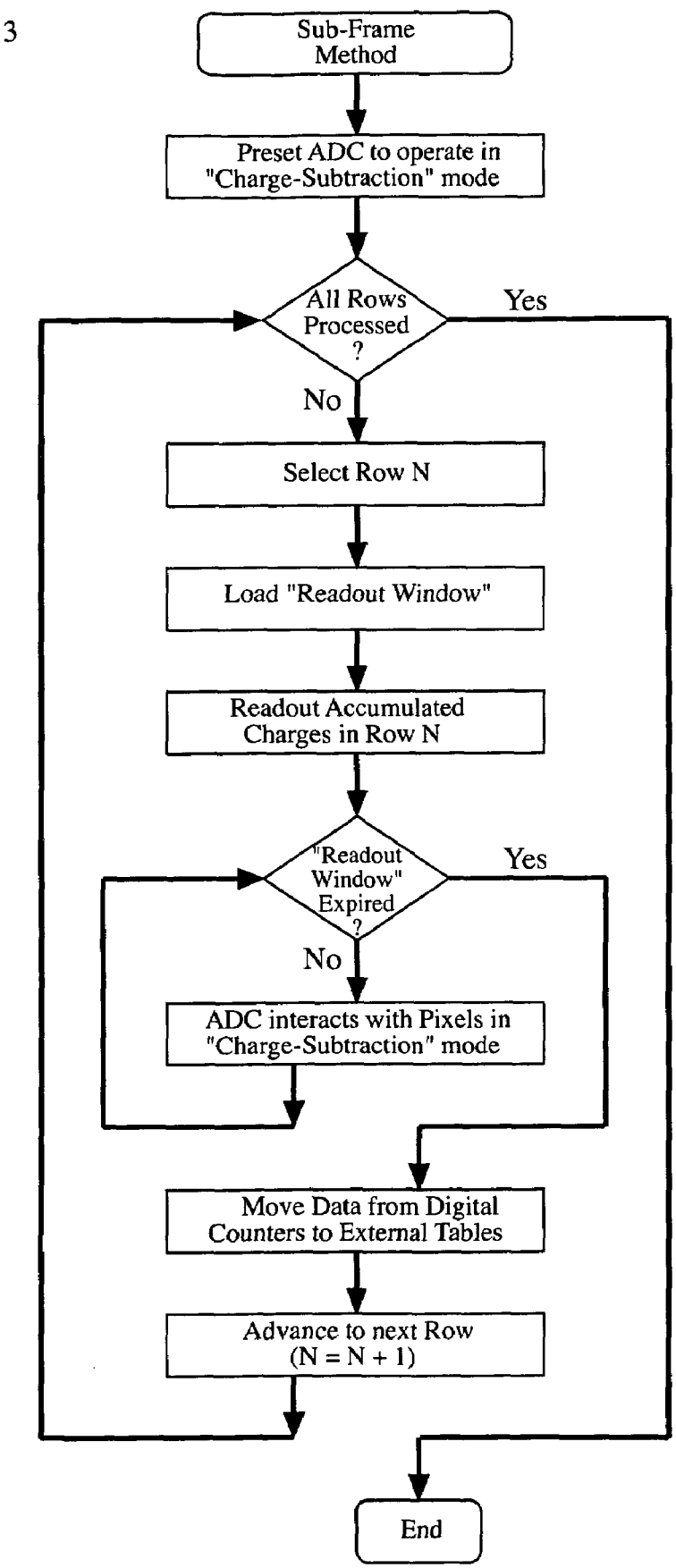

FIG. 1 shows a schematic block diagram of the ADC.
FIG. 2 shows a schematic circuit diagram, with a new transistor-level implementation, of the ADC.
FIG. 3 shows a schematic block diagram of the ADC for signals with both polarities.
FIG. 4 shows a schematic block diagram of the key elements in an image sensor system.
FIG. 5 shows a schematic block diagram connecting a pixel matrix to the column circuitry.
FIG. 6 shows a fluxogram describing the operations for the "Accumulation of Charges".
FIG. 7 shows a fluxogram describing the "Readout of "Accumulated Charges" from Row N".
FIG. 8 shows a fluxogram describing the measurement of "Photo-Current from Pixels of Row N".
FIG. 9 shows a fluxogram describing the "Edge/Pulse Detection from Pixels of Row N".
FIG. 10 shows a fluxogram describing the "Sequence A" of "Full-Frame" image formation method.
FIG. 11 shows a fluxogram describing the "Sequence B" of "Full-Frame" image formation method.
FIG. 12 shows a fluxogram describing the "Sequence C" of "Full-Frame" image formation method.
FIG. 13 shows a fluxogram describing the "Sub-Frame" image formation method.

DESCRIPTION OF THE INVENTION

The "Description of the Invention" is organized in three main sections.

Section #1 describes the new ADC for analog signals of a single polarity, which is a new implementation of the ADC methodology described in co-pending application Ser. No. 10/522,805. The different modes of operation are described in detail.

Section #2 describes the new ADC for analog signals with both polarities.

Section #3 describes the application of the ADC implementation described in Section #1, as the "column circuitry" of a CMOS image sensor comprising a matrix of avalanche pixels. In particular it describes the several modes of operation and interaction between the ADC and "avalanche pixels". Here the two modes of operation of the ADC are combined with the multiple ways in which the data acquisition by the individual pixels, and transfer to the ADC, can be accomplished. The data acquisition and transfer processes from the pixels through the ADC to the periphery circuitry, can combine one or more modes of operation of the ADC, and are grouped into four distinct manners of operation of the ensemble "pixel matrix+ADC+peripheral circuitry". These alternative manners include the conventional "Electronic Global Shutter" (EGS) and the "Electronic Rolling Shutter" (ERS), introduce a new "Shutter-less" mode, and the ability to perform 3D imaging through the time-of-flight (TOF) method.

Section #4, describes two distinctive methods of image formation. Operating the ensemble "pixel matrix+ADC+peripheral circuitry" in some of its modes, results in one method of image formation (Full-Frame Method), while operating it some other modes, results in another method of image formation (Sub-Frame Method). The two alternative methods of image formation are very different and carry very important consequences to key parameters of an acquired image, or sequence of images in a video stream.

Section #1: Description of the ADC for Analog Signals of a Single-polarity

An exemplary implementation of the ADC, for signals of just one polarity, is shown in the schematic block diagram of FIG. 1, and schematic circuit diagram of FIG. 2. In FIG. 1 and FIG. 2, the labels m1, m2, m3, etc, refer to possible multiple lines in parallel.

The ADC 139 consists of several circuitry blocks and lines or branches connecting them. The ADC 139 comprises the following circuitry blocks: one comparator 111 consisting of transistors T2, T3, T4, T5 and T6, plus transistors T1 & T10, a block of digitally addressable voltage sources 113 to set the reference voltage (Vref) of the comparator 111, asynchronous n-bit digital counter 114, a block of digitally addressable voltage sources 115 to set the potential to be applied to the signal source, a digital control unit 116, a block 117 storing the calibration data for the input capacitor (Cref) of the comparator 111, and a base-2 multiplier block 118, or an arithmetic table (not show in the figures).

The ADC 139 further comprises the following connecting lines or branches:

1. Line 121 connects the source signal to the drain of pass transistor T1;
2. Line 124 connects the source of T1 to the source of T3, and to the block of voltage sources 115 to be connected to the signal source;
3. Line 123 connects the digital control unit 116 to the gates of T1, T2, T3, T4, T7, and drain of T10;
4. Line 122 carries the signal Vref from the block of digitally addressed voltage sources 113 to the source of transistor T2 of the comparator 111;

5. Line 126 connects the digital control unit 116 to the gate of T10; line 125 connects the output of the comparator 111 to the digital control unit 116 and the source of T10;

6. A group of lines 127 connect the digital control unit 116 to the gates of the pass transistors in block of digitally addressable voltage sources 115 to set the potential to be applied to the signal source;

7. Group of lines 132 connect the digital control unit 116 to the gates of the pass transistors in the block of digitally addressable voltage sources 113 to set the signal Vref for the source of transistor T2 inside the comparator 111;

8. One or several lines 133 connect the output of the asynchronous n-bit digital counter 114 to the digital control unit 116;

9. One line 134 connects the digital control unit 116 to the asynchronous n-bit digital counter 114, to provide a "Reset" signal;

10. One line 135 connects the digital control unit 116 to the asynchronous n-bit digital counter 114, to provide an "Enable" signal;

11. One line 136 connects the digital control unit 116 to the input of the asynchronous n-bit digital counter 114, to provide said input with either the output signal 125 of the comparator 111, or an oscillating signal, such as that provided by a "ring oscillator" 137;

12. One or several lines 128 connect the digital control unit 116 to the block 117 storing the calibration data for the input capacitor (Cref) of the comparator 111;

13. One or several lines 129 connect the digital control unit to the 116 to the base-2 multiplier 118;

14. One or several lines 130 connect the block 117 storing the calibration data for the capacitor Cref, to the base-2 multiplier 118;

15. A group of lines 131 provides access to the output of the base-2 multiplier 118, that is, to the binary value corresponding to the analog input signal.

For certain applications it could be beneficial to have several ADCs sharing a single "Base-2 Multiplier" 118, and/or storing the Cref calibration data in tables external to the ADCs. Therefore, for certain applications, such as the one described below in which the ADC acts as the "column circuitry" of a CMOS image sensor, the block holding the calibration data 117 of the input capacitor (Cref), and the a "Base-2 Multiplier" 118, are external to the ADC, and are considered to be part of the "peripheral circuitry".

The asynchronous n-bit digital counter 114 works in a conventional manner. The key to "multi-mode" operation of the ADC (described below) is the analog block 112, which is a variation of the concepts presented in co-pending application Ser. No. 10/522,805. The block 112 is able to merge into a single comparator the two modes of operation, "Charge-Subtraction" and "Voltage-Extrapolation", which in said co-pending patent application were implemented with two separate comparators. The ability to operate in one or the other mode is essentially determined by the signals sent by the digital controller unit 116, to the gates of pass-transistors T1 and T11, as explained in detail below.

It should be noted that several transistors in block 112, in particular T1 and T3, could be designed and operated with a dynamic threshold voltage ("Dynamic Vt"), thereby minimizing the effect of these transistors on the flow of charge from/to the signal source and through the quantization process.

In a first mode, the ADC operates in a "Charge-Subtraction", in which it subtracts packets of charge with a pre-defined size, from the charge stored at the signal source. This mode of operation presupposes the signal source acting as a charge reservoir. The number of charge packets is counted by an asynchronous n-bit digital counter 114 coupled to the output 125 of the comparator 111. The output of the comparator is connected to the input of the comparator, so that when a transition takes place at the output of the comparator, it triggers the discharging of the input capacitor (Cref) of the comparator 111, making it ready to subtract one more packets of charge from the signal source. A digital control 116 dictates the voltage or charge applied to the reference capacitor (Cref) of the input of the comparator, and therefore the size of the packet charge that is subtracted from the external charge reservoir, that is, it dictates the quantization value.

In this "Charge-Subtraction" mode, the readout is done in a destructive fashion. The readout is complete when the residual amount of charge in the external charge reservoir is less than the pre-defined quantization value.

It should be noted that in co-pending application Ser. No. 10/522,805, the "Charge-Subtraction" circuitry had two reset commands, one called "local reset" and the other "global reset" or "external reset" (T1 & T3 in FIG. 1 of said co-pending application). In the specific implementation described in this disclosure, the "global reset" portion was removed from the circuitry. With the "local reset" circuitry, there is only one transistor (T1) inserted (inside the ADC) in the path of the signal traveling from the charge reservoir, to the input of the basic comparator block 111. A "global reset" command can be executed through the digital control unit.

In a second mode, the ADC operates in a "Voltage-Extrapolation" mode in which the transient, over the input capacitor (Cref) of the comparator 111, for a given target voltage swing, will allow the ADC to "extrapolate", by use of an associated arithmetic table or an arithmetic unit, the final value of the voltage and hence of the final quantization value.

The "Voltage-Extrapolation" method requires either an "arithmetic table" (not shown in figures) or a "Base-2 Multiplier" 118, and a "calibration value" 117 of the input capacitor of the comparator (which are not necessary for the "Charge-Subtraction" method). The "Base-2 Multiplier" (or an "arithmetic table") does not have to be part of the ADC, and for certain applications these elements can process data from several ADCs, as in the example shown in FIG. 4. The fundamental mathematical principles of this mode of operation were described in co-pending application Ser. No. 10/522,805, and will not be repeated here.

The following descriptions will use references to transistor devices as labeled in FIG. 2. It should be noted that in FIG. 1 connecting branches 128 and 129 represent multiple lines whose number depends on the number of voltage sources for Vref and for pixels, respectively. The example in FIG. 2 has 4 voltage sources possible to connect to the signal source, and 4 voltage sources for Vref. Naturally the number of voltage source for either purpose can be changed according to the needs of a particular application.

As explained in co-pending application Ser. No. 10/522,805, the "Voltage-Extrapolation" mode of operation involves ratios of time periods or ratios between numbers of oscillations with a well defined time period. These ratios do not depend on the absolute time period of the oscillations, and for this reason a simple oscillatory circuit, such as a "ring oscillator", can be used. Furthermore, this oscillatory circuit 137 is not driven or related to any of the properties of the input signal. The ring oscillator circuit is assumed to be part of the digital control unit 116. By measuring, and storing the value for the speed of the ring oscillator, it is possible to use absolute time, rather than just using a number of oscillations whose duration is unknown. For applications involving several ADCs, a table can be constructed with all values of the absolute time period of the oscillation of each ring oscillator.

In FIG. 1 and FIG. 2, the ring oscillator 137 is shown inside the digital control unit 116. These figures also show a qualitative description of how the signal from the ring oscillator 137 can be multiplexed 138 with the signal from the output 125 of the comparator 111, before connecting to the input of the digital counter 114. This multiplexing, controlled by logic inside the digital control unit, is necessary to enable the n-bit digital counter to be driven directly and asynchronously by the output 125 of the comparator 111 for the "Charge-Subtraction" mode, and to be driven by the ring oscillator for the "Voltage-Extrapolation" mode of the ADC.

The digital control unit 116 interacts with the digital counter 114 through several lines. Line 136 connects to the input of the asynchronous n-bit digital counter, line 135 carries the "enable" signal to the counter, and line 134 carries the "reset" signal to the counter 114, while the set of multiple lines 133 transfers the value of the counter to the digital control unit 116.

1.1. Common Operation Procedures: Pre-Loading and Calibration of Cref

In the description of the operation of the ADC, two procedures will be commonly mentioned: (1) Pre-loading of Cref, and (2) Calibration of Cref.

(1) Pre-Loading of Capacitor Cref is Done By (Refer to FIG. 2):

The digital control unit 116 activates signal 123 in order to:

1A. Turn OFF T3;
1B. Turn ON T2 & T4;

The digital control unit 116 activates one the signals from line 132 in order to:

1C. Turn ON one of the T9 transistors to selects the Vref voltage;

(2) Calibration of Capacitor Cref (for "Voltage-Extrapolation" Mode) is Done By:

Fixing the input voltage to the expected maximum voltage of input signal, for example 5 Volts, and using another reference voltage, for example 1 Volt, to determine the value of the time constant (RC). For any capacitor, this value has to be determined and stored in a register only once. After this procedure the value is available for any subsequent use in calculations.

1.2. ADC Operating in "Charge-Subtraction" Mode

Referring to FIG. 2, a "Local Reset" can be implemented by directly linking the gate of T1 (through line 126 to the output of the Comparator 125. This can be done with digital control unit 116 having T10 turned ON while the ADC operates in this mode. As explained in co-pending application Ser. No. 10/522,805 (see FIG. 4), the signal path from 125 to 126, through 116, can be fully asynchronous.

1. At time T=0, the Following Conditions Exist:
1A. Capacitor Cref has been pre-loaded with the desired Vref value.
1B. The digital counter 114 has been reset to zero.
1C. The signal source is OFF (not shown in Figures).
1D. T1 is ON.
1E. T2 & T4 are OFF.
1E. T3 is ON.
1F. T7 is ON, & all T8s are OFF.

2. Start Quantization Process
2A. Turn ON the signal source.
2B. If/when the charge in the signal source is larger than the pre-loaded value into the Cref, there will be a transition (for example from "Low" to "High") at the output 125 of the comparator 111, which will increase the value in the digital counter 114, and turn T1 OFF, through the connecting lines 125 and 126.
2C. While T1 is turned OFF, T3 remains ON, and Cref is discharged through line 124 and T7. When this happens, there is another transition at the output 125 of the comparator 111 (for example from "High" to "Low").
2D. The transition from "High" to "Low" at the output 125 of the comparator 111, turns ON T1, thereby exposing again the input capacitor (Cref) of the comparator 111 block to the pixel column.
2E. Steps D and E effectively "locally" reset the comparator 111, and finish a full cycle of counting a packet of charges with the "Charge-Subtraction" method.
2F. When the charge in signal source is smaller than the value pre-loaded to Cref, there will not be any more transitions at the output of the comparator 111, and T1 will not be switched OFF anymore.
3. Switch OFF signal source.
4. Transfer the base-2 binary value from the digital counter 114 to a circuitry external to the ADC, such as a "data table".
5. Repeat steps 2, 3, & 4, for any further quantization processes of source signal.

1.3. ADC Operating in "Voltage-Extrapolation" Mode

This mode of the ADC will be applied to measure charge flux (current) rather than a finite amount of charge. For sake of simplicity it will be assumed that during the interval of one measurement, the signal (current) does not change appreciably. In this mode, T1 is always "ON" during the time interval for one quantization process, and therefore acts as a resistive load, which under a constant current, provides a constant potential drop (voltage). In this mode the gate of T1 is not connected to the output 125 of the comparator 111, as the pass transistor T10 is kept always OFF by the signal carried by line 126 from the digital control unit 116.

The value of Vref can be selected by the digital control unit 116 turning ON, through lines 132, one of the T9 transistors (T9A, or T9B, or T9C, or T9D), to optimize different parameters. For example, to increase the speed of conversion, or to minimize the error of conversion. With appropriate digital circuitry to monitor the digital value of the input signal, it is possible to dynamically adjust in real time the magnitude of Vref. This can be used to optimize the total bandwidth available as a function of the evolution of the input signal.

The current and the measured voltage drop across T1 can be scaled up and down, by selecting different voltage sources to connect to the signal source. The selection of the voltage by the digital control unit 116 is done by turning ON, through lines 127, the T8 that is connected to the desired voltage source (T8A, or T8B, or T8C, or T8D).

The selection of Vref and voltage source (T8A, or T8B, or T8C, or T8D), can be adjusted in real time to obtain the optimal range of voltage drop across T1 and the optimal time interval Tref measured by the digital counter 114, used to count time.

The absence of transitions at the output of the comparator 111 could be an indication that the value of Vref is too large, and that a new quantization process with a smaller Vref should be attempted. If there are no transitions even when Vref is set at its minimum value, which is dependent on the noise level, then the digital counter 114 counting time is not stopped, and the digital control unit 116 allows the capacitor Cref to remain exposed to the input signal (Vin) until Vin becomes larger then Vref. Therefore it can be said that the quantization operation is asynchronous.

1. At Time T=0, the Following Conditions Exist:
1A. Capacitor Cref has been pre-loaded with the desirable voltage using one of the T9s.
1B. The digital counter 114 has been reset to zero.
1C. The signal source is OFF.
1D. T1 is ON & T10 is OFF.
1E. T2 is OFF & T3 is ON.
1F. T7 if ON, and all T8s are OFF 2. Start Quantization Process
2A. Turn ON the T8 connected to the largest voltage for linear gain.
2B. Simultaneously Turn ON the source signal, start the digital counters 114, and start counting time. Time is counted by the digital counter 114 when the digital control unit connects to the input of said counter 114, the output of a "ring oscillator", and at the same time disconnects the output 125 of the comparator 111 from the input of the digital counter 114.
2C. When the digital control unit 116 detects a transition at the output 125 of the comparator 111, it stops the digital counter 114, which registered the time interval Tref that it took for the voltage V(t) across the capacitor Cref reached the reference voltage Vref.
2D. Is Tref (or equivalently Vref) too small?
If YES, go to 2E.
In this case the current is too large, and the quantization procedure should be repeated with a larger value of Vref, until Tref is within a pre-defined range of digital values of the counter. However, if Vref is already taken to its maximum value, without Tref reaching the ideal interval, the quantization of the current can be repeated after selecting a T8 with a smaller voltage supply.
If NO, go to 4 (below).
2E. Turn ON the T8 connected to the immediately smaller voltage supply. For example, if the current T8 transistor that is ON is T8A, this steps selected transistor T8B as the next T8 transistor.
2F. Repeat 2B, 2C and 2D until Tref (or equivalently Vref) is no longer too small.
2G. If after quantizing the current with every single T8, Tref is still not in the ideal range, change Vref to a new value, and repeat steps 2A through 2G.
3. Switch OFF the signal source.
4. Transfer the base-2 binary value from the digital counter 114 and the Cref capacitor calibration data 117 into a "Base-2 Multiplier" 118. The product of the processing done at the "Base-2 Multiplier" 118 is then transferred to a circuitry external to the ADC, such as a "data table".
5. Repeat steps 2A through 2D for any further quantization processes of source signal.

1.4. ADC Operating in "Voltage-Extrapolation" Mode for Detection of Current or Voltage Edge/Pulse In addition to using the "Charge-Subtraction" and "Voltage-Extrapolation" modes of operation to quantize the amplitude of a signal, the "Voltage-Extrapolation" mode can also be used to detect current or voltage edges or pulses, which in turn can be used for timing purposes.

The following describes how the ADC of the present invention can be operated for detection of a current or voltage edge/pulse. The interaction between the digital control unit 116, the analog block 112, and the digital counter 114 are different from its use in the previously described "Voltage-Extrapolation" mode. The digital counter 114 will be used to count time, as explained in subsection 1.3.

1. At Time T=0, the Following Conditions Exist:
1A. Capacitor Cref has been pre-loaded with the desirable voltage using one of the T9s.
1B. The signal source is OFF.
1C. T1 is ON & T10 is OFF.
1D. T2 is OFF & T3 is ON.
1E. T7 if ON, and all T8s are OFF.

2. Start Edge/Pulse Detection
2A. The digital counter 114 are reset to zero.
2B. Turn ON the T8 connected to the voltage supply with which the signal source will have a non-linear behavior.
2C. Simultaneously do:
Turn ON signal source,
Trigger external excitation, for example, voltage pulse, or light pulse (flash),
Start the digital counter 114 to count time,
2D. When the digital control unit 116 detects a transition at the output 125 of the comparator 111, it stops the digital counter 114. The digital counter 114 register the time interval it took between the triggering of the external excitation and the detection of an edge/pulse by the ADC.
2E. A pre-defined time interval sets the allowed time to "wait" for response to the external excitation, and if at the end of that time no edge/pulse has been detected, then the digital control unit 116 orders the counter to stop.
3. Turn OFF signal source
4. Transfer the base-2 binary value of the digital counter 114 to a circuitry external to the ADC, such as a "data table".
5. Repeat steps 2A through 4 for any further quantization processes of source signal.

Section #2: Description of the ADC for Analog Signals with Both Polarities

FIG. 3 shows the schematic block diagram of an exemplary implementation of the ADC for signals with both polarities.

The circuit shown in FIG. 3 is formed by the duplication and mirroring of the circuit shown in FIG. 1, with the exception of the digital control unit 116, which is shared for signals of both polarities. In FIG. 3, the blocks and connecting branches are identified by the same numbers as in FIG. 1 and FIG. 2, with the addition of the (−) and (+) signs to mark the blocks dedicated to signals of negative and positive polarities, respectively. The circuitry dedicated to each polarity operates independently, and it is even possible for one to operate in the "Charge-Subtraction" more while the other operates in the "Voltage-Extrapolation" mode. In FIG. 3 the digital control unit is responsible for combining the two binary (base2) streams of data into a single unified (131+ & 131−) binary data stream.

Since FIG. 3 is a block diagram, the transistors inside the comparator blocks (111+ & 111−) are not shown. That is also the case with blocks 113+ & 113−, and 115+ & 115−. Hover, given the symmetry of the diagram, the counter parts to transistors shown in FIG. 2, for example T3− as counterpart of T3+, are obvious to infer.

The ADC for analog signals of both polarities, comprises the following circuitry blocks: two comparators 111+ & 111−, four pass transistors (T1+, T1−, T10+ & T10−), two blocks of digitally addressable voltage sources 113+ & 113− to set the reference voltages Vref+ & Vref− respectively of the comparators 111+ & 111−, two asynchronous n-bit digital counters (114+ & 114−), two blocks of digitally addressable voltage sources (115+ & 115−) to set the potential to be applied to the signal source, a digital control unit 116, two blocks (117+ & 117−) storing the calibration data for the input capacitors Cref+ & Cref− respectively of the comparators (111+ & 111−), and two base-2 multiplier blocks (118+ & 118−), or two arithmetic tables (not show in the figures).

The ADC for analog signals of both polarities, further comprises the following connecting lines or branches:

1. Line 121+ (121−) connects the source signal to the drain of pass transistor T1+ (T1−);
2. Line 124+ (124−) connects the source of T1+ (T1−) to the source of T3+ (T3−), and to the block of voltage sources 115+ (115−) to be connected to the signal source;
3. Line 123+ (123−) connects the digital control unit 116 to the gates of T1+ (T1−), T2+ (T2−), T3+ (T3−), T4+ (T4−), T7+ (T7−), and drain of T10+ (T10−);
4. Line 122+ (122−) carries the signal Vref+ (Vref−) from the block of digitally addressed voltage sources 113+ (113−) to the source of transistor T2+ (T2−) of the comparator 111+ (111−);
5. Line 126+ (126−) connects the digital control unit 116+ (116−) to the gate of T10+ (T10−); line 125+ (125−) connects the output of the comparator 111+ (111−) to the digital control unit 116 and the source of T10+ (T10−);
6. A group of lines 127+ (127−) connect the digital control unit 116 to the gates of the pass transistors in block of digitally addressable voltage sources 115+ (115−) to set the potential to be applied to the signal source;
7. Group of lines 132+ (132−) connect the digital control unit 116 to the gates of the pass transistors in the block of digitally addressable voltage sources 113+ (113−) to set the signal Vref+ (Vref−) for the source of transistor T2+ (T2−) inside the comparator 111+ (111−);
8. One or several lines 133+ (133−) connect the output of the asynchronous n-bit digital counter 114+ (114−) to the digital control unit 116;
9. One line 134+ (134−) connects the digital control unit 116 to the asynchronous n-bit digital counter 114+ (114−), to provide a "Reset" signal;
10. One line 135+ (135−) connects the digital control unit 116 to the asynchronous n-bit digital counter 114+ (114−), to provide an "Enable" signal;
11. One line 136+ (136−) connects the digital control unit 116 to the input of the asynchronous n-bit digital counter 114+ (114−), to provide said input with either the output signal 125+ (125−) of the comparator 111+ (111−), or an oscillating signal, such as that provided by a "ring oscillator" 137;
12. One or several lines 128+ (128−) connect the digital control unit 116 to the block 117+ (117−) storing the calibration data for the input capacitor Cref+ (Cref−) of the comparator 111+ (111−);
13. One or several lines 129+ (129−) connect the digital control unit to the 116 to the base-2 multiplier 118+ (118−);
14. One or several lines 130+ (130−) connect the block 117+ (117−) storing the calibration data for the capacitor Cref+ (Cref−), to the base-2 multiplier 118+ (118−);
15. A group of lines 131 provides access to the combined output of the base-2 multipliers 118+ & 118−, that is, to the binary value corresponding to the analog input signal.

Section #3: ADC as "Column Circuitry" of an Image Sensor

The ADC of the present invention, with its multiple modes of operation, is ideally suited to be used as the "column circuitry" of image sensors in general, and in particular of CMOS image sensors with "avalanche pixels", such as those fabricated according to U.S. Pat. No. 6,943, 051 B2, and with layouts such as those described in PCT/EP2005/008182 (filed in 28 Jul. 2005).

FIG. 4 shows a schematic block diagram of the key elements of an exemplary image sensor system. In this block diagram the top 143 and bottom 144 blocks of "column circuitry", are identical, and are each a set of ADCs in parallel, each being connected to a data column line in the pixel matrix 140. There will be as many ADCs as there are data column lines, which may or may not be identical to the number of actual pixel columns, depending on the layout, as exemplified in PCT/EP2005/008182 (filed in 28 Jul. 2005). The blocks 140 are 141 are shown connected by a branch 150 with multiple lines, including the digital signals by which the block 141 commands the Row-Select Transistors inside block 140, and for the analog signals, such as the bias applied to the top electrode of the avalanche photo-diodes (APDs), which is shared by all APDs in the pixel matrix 140. Block 140 is also connected to block 143 of column ADCs through branch 154 with multiple lines, and is also connected to block 144 of column ADCs through branch 155 with multiple lines. Block 140 has also branch 158 with multiple lines, connecting it to external circuitry. Block 142 is a logic unit, comprising a "run length encoder", connected to block 141 through branch 151 with multiple lines, connected to block 143 of column ADCs through branch 156 with multiple lines, connected to block 144 of column ADCs through branch 157 with multiple lines, connected to external circuitry through branch 159 with multiple lines. Block 145 is a table with Cref calibration of all ADCs from blocks 143 and 144, and is connected to block 142 through branch 160 with multiple lines, and block 146 through branch 161 with multiple lines. Block 146 is composed of one or several multiplier base-2, and is connected to block 142 through branch 162 with multiple lines. Block 147 is a table with timing data to be used for 3D imaging and is connected to block 142 through branch 163 with multiple lines. Blocks 148a through 148n comprise bit-planes #1 through #n, to be used for the Sub-Frame Method, and are connected to block 142 through branches 148a to 148n, each with multiple lines.

FIG. 5 schematically shows in details on how the connecting branches 152 and 153, each represent all the data column lines connecting to the ADCs in the top and bottom blocks respectively. Similarly, but not shown in detail in the figures, the connecting branches 150, 151, 154, 155, 156, 157, 158, 159, 160, each represent several connecting lines.

This section focuses on the data acquisition and transfer process, which depend on the conditions of operation inside the pixels, the mode of operation of the ADC and the interaction between the pixels and the ADC plus its associated circuitry. In this section it is explained how all the different parameters can be combined for optimal results. It should be noted that some of the possibilities described below for data acquisition and transfer are only possible because the pixels in question have photo-diodes that can be operated in the avalanche mode.

The generic description of the modes of operation of the ADC from the Section #1, can be easily adapted to this application of the ADC, by noting that in the context of this section the generic "signal source" can be translated into "pixels", and that turning ON and OFF said signal sources translates into turning ON and OFF the Row-Select Transistors (RSTs) inside the pixels.

Also from the perspective of image sensing, the entire sub-section 1.4 can be applied for "Time-of-Flight" measurements for 3D image sensing, in which the "avalanche pixels" are operated in the Geiger mode (non-linear gain). In this context, the externally triggered excitation takes the form of a "flash" for example. For another application of the ADC, namely RF digitization, the externally applied excitation could be an electromagnetic pulse (for example radar).

The point 5 of each of the sub-sections, 1.2 (ADC Operating in "Charge-Subtraction" mode), 1.3 (ADC Operating in "Voltage-Extrapolation" mode), and 1.4 (ADC Operating in "Voltage-Extrapolation" mode for detection of current or voltage edge/pulse), relates to the further repetition of the sequences of steps for the processing of the source signal. For CMOS image sensors this particular point directly relates to the repetition of those sequences of steps for each row of the pixel matrix, proceeding in a row-by-row fashion.

Therefore, in the full context of this section, and per the last two paragraphs, the application of the ADC of the present invention as column circuitry of CMOS image sensors, can be easily described by performing simple adjustments to the wording of the statements providing the generic description of the several modes of operation of the ADC.

In order to avoid the repetition of long portions of the description, provided in Section #1, of the operating modes of the ADC, the following is a list, organized by sub-section, of the statements that are different from those given in Section #1:

Sub-section 1.2

1C. The row-select transistor (RST) inside the pixel is turned OFF (not shown in Figures).

2. Start Readout Process for Row #N
2A. Turn ON all RSTs of Row #N.
3. Switch OFF all the RSTs of Row #N.
5. Repeat steps 2, 3, & 4, until all rows have been readout.

Sub-Section 1.3

1D. The row-select transistor (RST) inside the pixel is OFF.

2. Start Readout Process for Row #N
2B. Simultaneously Turn ON all RSTs of Row #N, and start the Digital Counters to count time.
3. Switch OFF all the RSTs of Row #N.
5. Repeat steps 2A through 2D until all rows have been readout.

Sub-Section 1.4

1B. The row-select transistor (RST) inside the pixel is OFF.

2. Start Readout Process for Row #N
2C. Simultaneously do:
  Turn ON all RSTs of Row #N,
  Send a light pulse (flash),
  Start the digital counters to count time,
2D. When the digital control unit 116 detects a transition at the output 125 of the comparator 111, it stops the digital counter 114. The digital counters 114 registers the time interval it took the light pulse to travel towards the objects, be reflected by the objects, and travel back towards the sensor.
2E. At the end of the pre-defined time interval allowed to "wait" for reflected photons (which determines the maximum distance to objects possible to map), stop any counter that may still be running.
3. Switch OFF all the RSTs of Row #N.
4. Transfer the values of the digital counter 114 to an external "timing table" (not shown in the figures).
5. Repeat steps 2 through 4 until all rows have been readout.

In the general description of the ADC in Section #1, it is mentioned that the calibration values of the input capacitor of the comparator Cref, as well as the exact time duration of the oscillating period of the ring oscillator (R.O.) in each digital control unit 116, can be stored outside the ADC itself for later use in calculations. In the context of using the ADC as the column circuitry of image sensors with avalanche pixels, it is also possible to use the ADCs to calibrate the avalanche gain of each pixel in the matrix, under different voltage and illumination conditions, and store their calibration values in tables. This calibration data can be used later in calculations to compensate for possible variations in avalanche gain across the pixel matrix that can result from variations in the semiconductor fabrication process.

For the reminder of this document, the following are useful definitions in the context of image sensing:

"Electronic Global Shutter"—EGS)—pixels operate in "accumulation of charges", and the ADC operates in the "Charge-Subtraction" mode. This mode is particularly suitable for the pixels capturing low light intensity, that is, for pixels with low dynamic range.

"Electronic Rolling Shutter" (1)—ERS-1—pixels and column circuitry operate in "photo-current with linear gain", is particularly suitable for the pixels capturing high light intensity, that is, for pixels with high dynamic range.

"Electronic Rolling Shutter" (2)—ERS-2—pixels and ADC operate in "photo-current with non-linear gain" or "Geiger mode", in which the ADC detects signal edges/pulses, for the purpose of determining the distance to objects through the "Time-Of-Flight" (TOF) method.

"Shutter-less"—pixels operating continuously (shutter always ON), allowing for non-interrupted "time integration" or "accumulation charges", while simultaneously there is a readout process cycling through all rows, in which the ADCs operating in the "Charge-Subtraction" mode, subtract only one packet of charge from each pixel in each cycle of the readout process.

3.1. Operation with "Electronic Global Shutter" (EGS)

In this setting the APDs are operated in the linear avalanche gain region, and the pixels are operated in the "accumulation of charges" mode, meaning that photo-generated, avalanche-multiplied, charges are stored in a capacitor inside each pixel until the readout process begins. The number of charges accumulated inside each pixel is linearly proportional to the number of photons absorbed by the photo-diode during a certain period of time.

For the "avalanche pixels" described in U.S. Pat. No. 6,943,051 B2, and with layouts such as some of those described in PCT/EP2005/008182 (filed in 28 Jul. 2005), for CMOS circuits fabricated with bulk silicon wafers the charge is stored at the n-Well/p-Sub junction, which acts as a storage capacitor when the respective row-select transistor (RST) is off. For CMOS circuits fabricated with different substrates, such as thick-film (partially depleted) silicon-on-insulator, the charge could be stored at the capacitor formed by the p-Well/buried-oxide/silicon-substrate. For CMOS circuitry fabricated using substrates such as thin-film (fully depleted) silicon-on-insulator or germanium-on-insulator, an in-pixel capacitor can be formed in a manner similar to that for partially-depleted SOI, or with other structures.

Whereas a normal photo-diode generates only one electron-hole pair per absorbed photon, an APD can generate an amount of charge that is many times more (for example, 100) the number of absorbed photons. The proportion factor between the number of photons and the number of charges generated is the avalanche gain.

Signal acquisition and readout for the EGS mode are as follows:

1. Signal Acquisition (Described in the Fluxogram of FIG. 6)
1A. Pre-definition of "integration time" or "shutter window" for all pixels in the sensor matrix.
1B. Pixels absorb light and store charge during the "integration time", simultaneously for the entire sensor matrix. The "integration time" is set by the width of a voltage pulse that is applied to all photo-diodes in parallel, and whose amplitude defines the avalanche gain. The voltage pulse in question is applied to the terminal that is common to all photo-diodes in the sensor matrix, and which is not shown in the Figures.

2. Readout Process (Described in the Fluxogram of FIG. 7)
2A. Selection of N-Row
2B. Enable direct interaction between "charge reservoir" (capacitor) inside the pixel of selected row and the ADC. The ADC will be operating in the "Charge-Subtraction" mode, in which it subtracts a pre-defined amount of charge from the pixel, and counts how many times that pre-defined amount of charge was subtracted from the pixel. The amount of charge to be subtracted can be modified through software control.
2C. The time interval during which there is a direct interaction between a pixel and the ADC is software-programmable.
2D. When the pre-defined time interval for direct interaction between a pixel and the ADC is exhausted, there is de-selection of N-Row, and selection of another Row (e.g., N+1).
3. The entire process from 2A to 2D is repeated until all rows have been selected and all pixels have interacted with the ADC.

This is a destructive readout method that is completed when the residual amount of charge inside the pixel is less than the pre-defined quantization value. Because of the avalanche gain, the total amount of charge generated by the absorption of a single photon can be many times larger than the quantization value of the ADC, effectively resulting in a noise-less readout/quantization process.

In the procedure just described, there are two main parameters determining the maximum dynamic range. The first parameter is the maximum amount of charge possible to store inside each pixel. The second parameter is the maximum number of "packets of charge" that the ADC is capable of subtracting from the pixel during the time interval available for the readout of one row, which is the duration allowed for the direct interaction between a pixel and the column ADC. The speed with which the ADC can subtract those "packets of charges" is determined by the internal speed of the ADC as well as by the capacitances associated with the readout circuit elements.

3.2. Operation with "Electronic Rolling Shutter" for Light Intensity Signals (ERS-1)

In this mode of operation, the APDs are operated in the photo-current mode, and the current is linearly proportional to the flux of photons that are absorbed in the APDs. The proportionality factor is provided by the avalanche gain. Different avalanche gain levels can be obtained by applying different voltage levels at the terminals of the APDs, that is, by selecting different T8 transistors (T8A, or T8B, or T8C, or T8D).

The avalanche gain is software-programmable and adjustable in real-time, to the photon flux and/or other parameters. This capability can be used to produce a photo-current signal that falls within an interval of optimal electronic current intensity, in which a large photon-flux (strong illumination) requires a small avalanche gain, and a small photon-flux (weak illumination) requires large avalanche gain.

The signal produced by each pixel is a photo-current that is quantized by the column ADC operating in the "voltage-to-frequency" mode, in which the transient across a capacitor is used to evaluate the final voltage. In this mode the data acquisition and readout are simultaneous.

The Data Acquisition & Readout Process is as Follows (Described in the Fluxogram of FIG. 8):
1. Selection of N-Row.
2. From the ADC, apply maximum voltage setting to the bottom terminal of the APD.
3. Verify that there is no current saturation (linear avalanche mode).
4. If there is current saturation, select the voltage level immediately below the one just used.
5. Repeat C & D, until there is no saturation of avalanche current.
6. Measure voltage drop with ADC operating in "Voltage-Extrapolation" mode.
7. De-selection of N-Row.
8. Selection of (N+1)-Row.

Repeat steps 2 through 8 until all rows have been read.

If the linear gain is not constant, but rather is dependent on the strength of the source signal, it may happen that the current being read and quantized, for a given voltage source (corresponding to a specific T8 transistor being selected), cannot be uniquely associated with one particular photon flux. In order to remove any uncertainty, the same pixel/APD should be measured/quantized twice by alternatively selecting two different T8 transistors being used for as voltage source for the signal source.

3.3. Operation with "Electronic Rolling Shutter" for Edge/Pulse Signal Detection (ERS-2)

The signal is originated by each pixel only when that pixel is part of the selected row of pixels, that is, the signal is originated simultaneously with the row-by-row readout procedure. The entire 3D mapping of the image being acquired is completed when the sequence of row-selection has covered every single row of pixels. It should be kept in mind that the data being acquired and readout in this mode is not light intensity, but the photon's "Time-Of-Flight" (TOF), between the point of light emission and sensing, and the objects being imaged.

The APD in each pixel is operated in the Geiger mode, that is, in the non-linear avalanche mode in which the absorption of a single photon leads to saturated current, and the digital counter is used as a "timer" to count a time interval. Also in this mode the data acquisition and readout are simultaneous.

The Data Acquisition & Readout Process is as Follows (Described in the Fluxogram of FIG. 9):
1. The N-Row is selected.
2. Photons are emitted from the point of observation.
3. "Column counters" start counting time.
4. When the APD of a given pixel generates a large photo-current, it stops the respective column counter.

5. De-selection of N-Row, and selection of another Row (e.g., N+1).

Repeat steps 2 through 8 until all rows have been read.

If during the time during which a given row of pixels is selected, the APD does not detect a single photon, the counter is not stopped until a reset signal marks the de-selection of that row. This means that the objects were either too far or non-existent. By increasing the time period during which a row is selected enables the detection photons with longer TOF, and thus of more distant objects. At the same time choosing shorter time intervals during which a row is selected provides a filtering mechanism that excludes objects whose distance is larger than the threshold set by the time allowed for the absorption of reflected photons.

3.4. Operation Without a Shutter (Shutter-Less Operation)

As it will be explained below, in this mode the readout process is different from the well-known "Electronic Global Shutter" (EGS) or the "Electronic Rolling Shutter" (ERS-1). In this mode the data acquisition and readout are simultaneous, but it is conceptually different from any ERS methods.

It is possible to define a "shutter-less" mode of operation, by taking advantage of a unique property of the ADC in "Charge-Subtraction" mode. The unique property is that the interaction between the ADC and the "charge reservoir" inside the pixel can take place at the same time that more charges are added to the "charge reservoir" of that same pixel. Consequently, the readout process can take place during the "integration time", resulting in simultaneous light absorption and readout of "accumulated charges". As it will be seen later, the ability to perform these two functions simultaneously and in parallel, leads to a redefinition of the concept of "shutter window" ("integration time").

The Data Acquisition & Readout Process is as Follows:
1. Light can be absorbed, all the time (shutter-less), by all pixels in the sensor matrix.
2. Readout is continuously performed (row by row) for all pixels of the sensor matrix.
3. Selection of N-Row for a pre-determined amount of time. (This "Readout Window" should not to be confused with "Shutter Window").
4. During the "Readout Window", in each column a single pixel interacts directly with the column ADC in the "Charge-Subtraction" mode, and the "Readout Window" limits the maximum number of "packets of charge" that can be subtracted by the ADC from the charge reservoir inside the pixel.
5. Each "packet of charge" that is subtracted from the charge reservoir inside a pixel, causes a change of state at the output of the ADC, which in turn drives the n-bit digital counter asynchronously.
6. The "Readout Window" is software-programmable, and the end of a "Readout Window" leads to the selection of another Row (e.g., N+1), and readout of the respective pixels.

The entire process from 1 to 6 is repeated until all rows have been selected and all pixels have interacted with the column ADC. The "Readout Window" can be set to allow one or more "packets of charge" to be subtracted from each pixel.

It should be noted that image acquisition through accumulation of charges, typical of conventional CCDs and CMOS image sensors, results in a signal, and therefore a dynamic range, that increases with integration time. Alternatively, with image acquisition through the measurement of the photon flux, as it is the case with photo-diodes operating in a photo-current mode, the signal (current) and the dynamic range do not increase with increasing acquisition time (there is no time integration of the signal, and the flux of electrons is linearly proportional (with or without avalanche gain) to the flux of photons.

For Shutter-less Operation it is Necessary to Make a Distinction Between:

Still Images—Images without relative motion between object(s) and the sensor.

Moving Images (Video)—Images with relative motion between object(s) and the sensor.

Unlike for Still Images, for Video it is necessary to define a "Frame-Rate" and hence a "Frame", which imposes an upper limit, for each "Frame", on the "integration time" or "shutter window" (defined after the image has been acquired and readout).

Section #4: Methods of Image Formation Enabled by the New ADC

The several modes of operation of the ensemble "pixel matrix+ADC+peripheral circuitry" can be combined to achieve different goals. This section describes two alternative "methods of image formation", making use of different modes of operation of the ensemble "pixel matrix+ADC+peripheral circuitry". The two fundamental methods of image formation, which can be used individually or combined, both capable of 3D imaging, are:

"Full-Frame" Method: Each readout cycle produces a complete frame

"Sub-Frame" Method: Each readout cycle produces one Sub-Frame

In this description, a cycle denotes the extraction and quantization of pixel data, from all the rows of the pixel matrix, one row at a time.

4.1. Definition of "Full-Frame" Method

One "Full-Frame" is a table of digital values, each several bits deep, with a one-to-one correspondence with the matrix of pixels constituting the image sensor. In one full-frame, each entry is the quantized total value of intensity of light absorbed in the corresponding pixel (photo-diode). In addition, the entry for each pixel may have an attached "timing value" for purposes of 3D imaging. The maximum number of bits allowed to be recorded for each entry, dictates the maximum dynamic range for the entire "Full-Frame".

A Full-Frame of all the pixels in the image sensor with 3D information for each pixel, can be obtained in several different alternative sequences of steps for signal acquisition and transfer, which are described in "Sequence A" through "Sequence C".

In the following sequences, "First Table", "Second Table", and "Third Table" will be used to indicate tables composed of digital quantification of charge amplitude values acquired through the "Accumulation Charges" method, digital quantification of current amplitude values acquired through the "Photo-Current" method, and digital quantification time values acquired through the "Time-Of-Flight" method, respectively.

"Sequence A" (Described in the Fluxogram of FIG. 10)

This sequence of operations, illustrated by the fluxogram in FIG. 10 and using the basic operations illustrated in figures FIG. 6, FIG. 7, FIG. 8 and FIG. 9, is divided into two major phases. During the first phase, the digital control unit 116 acquires an entire image using the accumulation of charges. In a second phase, the digital control unit 116 executes a sequence of three operations for each of the rows of the image matrix in turn, namely, a readout of the accumulated charges followed by measurement of the photo-current with linear gain over the same row, followed by the edge/pulse detection using Geiger mode still for the same row. After all operations are executed for a given row, the digital control unit 116 moves to the next row in the pixel matrix until it has covered the entire set of rows of the pixel matrix.

First-Phase—"Accumulation of Charges"

Operation 1. Accumulate Charges in Pixels for All Rows of the Pixel Matrix
1A. Define "Electronic Global Shutter" window (integration time).
1B. All rows are de-selected (all RSTs are OFF).
1C. Apply negative voltage pulse at the common top electrode of the APDs. The pulse width (duration of the pulse) defines the shutter window.

Second Phase—Row-by-Row Readout of Accumulated Charges+Measurement of Photo-Current with Linear Gain+Edge/Pulse Detection for Geiger Mode For each row of the pixel matrix perform the following operations.

Operation 2. Readout of Accumulated Charges in pixels of Row "N"
2A. Pre-select the ADC and digital counter in each column to operate in the charge-to-frequency mode, and define also the time interval available for readout.
2B. Select Row "N" (turn on all RSTs in Row "N"), to begin the interaction between "charge reservoirs" and "ADC+Counter".
2C. At the end of the pre-defined readout time, move data from counters to row "N" of "First-Table".

Operation 3. Measure Photo-Current (Linear Gain) in Pixels of Row "N"
3A. Pre-select the ADC and digital counter in each column to operate in the voltage-to-time mode.
3B. Select Row "N" (turn ON all RSTs in Row "N").
3C. Apply suitable voltage to APD for measuring photo-current:
  3C1. Apply negative potential at the top electrode (shared by all APDs). The pixels with RSTs turned OFF have an applied voltage whose magnitude is equal or less than the magnitude of this negative potential, which is not enough to provide avalanche conditions.
  3C2. Apply positive potential at the column readout line. The APDs in the pixels with RSTs turned OFF are not affected by this positive potential.
  3C3. The APDs in pixels with RSTs turned ON, are under a total applied voltage that is the sum of the negative and positive potentials, which is chosen for its suitability to measure photo-current with large linear avalanche gain.
3D. Measure photo-current with column ADC operating in the voltage-to-time mode.
3E. Move data from counters to row "N" of "Second-Table".

Operation 4. Edge/Pulse Detection (Geiger) in Pixels of Row "N"
4A. Set ADC to measure Time-Of-Flight (TOF)
  4A1. Apply negative potential on top (common) terminal of all APDs (can be same as 3C1).
  4A2. Apply positive potential at the column line such that the voltage across the APDs of Row "N" is suitable for Geiger mode.
4B. Simultaneously do:
  4B1. Emit light pulse in the suitable range of wavelengths (e.g., Short Wavelength Infra-Red).
  4B2. Begin counting time using column "digital counter".
4C. Absorption of at least one photon induces a large current/voltage swing at the APD, which stops the column "digital counter";
4D. Move data from counters to "Third-Table".
4E. De-selection of Row "N"

Repeat operations 2 through 4 for subsequent rows in turn.

Merge data from "First-Table", "Second-Table" and "Third-Table", into a new table with a suitable format.

"Sequence B" (Described in the Fluxogram of FIG. 11)

This sequence, illustrated by the fluxogram in FIG. 11, is divided into three phases. During the first phase, the digital control unit 116 acquires an entire image using the accumulation of charges method. The second phase the digital control unit 116 reads out the digital values corresponding to the accumulated charges for all rows of the pixel matrix, one row at a time. Once this readout is complete and given that it is destructive, the digital control unit 116 uses a third phase to measure the photo-current and perform a edge/pulse detection for the pixels of each row.

First-Phase—"Accumulation of Charges"

Operation 1. Accumulate Charges in Pixels for All Rows of the Pixel Matrix
1A. Define "Electronic Global Shutter" window (integration time).
1B. All rows are de-selected (all RSTs are OFF).
1C. Apply negative voltage pulse at the common top electrode of the APDs. The pulse width (duration of the pulse) defines the shutter window.

Second Phase—Row-by-Row Readout of Accumulated Charges

For each row of the pixel matrix perform the following operations.

Operation 2. Readout of Accumulated Charges in Pixels of Row "N"
2A. Pre-select the ADC and digital counter in each column to operate in the charge-to-frequency mode, and define also the time interval available for readout.
2B. Select Row "N" (turn ON all RSTs in Row "N"), begin interaction between "charge reservoirs" and "ADC+Counter".
2C. At the end of the pre-defined readout time, move data from counters to row "N" of "First-Table".

Repeat operation 2 for subsequent rows in turn.

Third Phase—Measurement of Photo-Current (Linear Gain)+Edge/Pulse Detection (Geiger Mode)

For each row of the pixel matrix perform the following operations 3 and 4.

Operation 3. Measure Photo-Current (Linear Gain) in Pixels of Row "N"
3A. Pre-select the ADC and digital counter in each column to operate in the voltage-to-time mode.
3B. Select Row "N" (turn ON all RSTs in Row "N").
3C. Apply suitable voltage to APD for measuring photo-current:
  3C1. Apply negative potential at the top electrode (shared by all APDs). The pixels with RSTs turned OFF have an applied voltage whose magnitude is equal or less than the magnitude of this negative potential, which is not enough to provide avalanche conditions.
  3C2. Apply positive potential at the column readout line. The APDs in the pixels with RSTs turned OFF are not affected by this positive potential.

3C3. The APDs in pixels with RSTs turned ON, are under a total applied voltage that is the sum of the negative and positive potentials, which is chosen for its suitability to measure photo-current with large linear avalanche gain.

3D. Measure photo-current with column ADC working in the voltage-to-time mode.

3E. Move data from counters to row "N" of "Second-Table".

Operation 4. Edge/Pulse Detection (Geiger Mode) in Pixels of Row "N"

4A. Set APDs of Row "N" and ADC to operate in the "Edge/Pulse Detection" mode.

4A1. Apply negative potential common terminal of all APDs (can be same as 3C1).

4A2. Apply positive potential at the column line such that the voltage across the APDs of Row "N" is suitable for Geiger mode.

4B. Simultaneously do:

4B1. Emit light pulse in the suitable range of wavelengths (e.g., Short Wavelength Infra-Red).

4B2. Begin counting time using column "digital counter".

4C. Detection current step or pulse coming from APD, and stopping of column "digital counter".

4D. Move data from counters to row "N" of "Third-Table".

4E. De-selection of Row "N"

Repeat operation 2 and 4 for subsequent rows in turn.

Merge data from "First-Table", "Second-Table" and "Third-Table", into a new table with a suitable format.

"Sequence C" (Described in the Fluxogram of FIG. 12)

In this sequence, illustrated by the fluxogram in FIG. 12 is divided into four phases. During the first phase, the digital control unit 116 acquires an entire image using the accumulation of charges. In the second phase the digital control unit 116 reads out the digital values corresponding to the accumulated charges for all rows of the pixel matrix, one at a time. On this readout is complete and given that it is destructive, the digital control unit 116 uses a third phase to measure the photo-current over the pixel on each row of the pixel matrix one row at a time. Finally, in the Fourth Phase, the digital control unit 116 performs the Edge/Pulse Detection for each row of the pixel matrix, one row at a time.

First Phase—"Accumulation of Charges"

Operation 1. Accumulate Charges in Pixels for All Rows of the Pixel Matrix

1A. Define "Electronic Global Shutter" window (integration time).

1B. All rows are de-selected (all RSTs are OFF).

1C. Apply negative voltage pulse at the common top electrode of the APDs. The pulse width (duration of the pulse) defines the shutter window.

Repeat operation 1 for subsequent rows in turn.

Second Phase—Readout of "Accumulated Charges" for All Rows

Operation 2. Readout of Accumulate Charges in Pixels for All Rows of the Pixel Matrix 2A. Pre-select the ADC and digital counter in each column to operate in the charge-to-frequency mode, and define also the time interval available for readout.

2B. Select Row "N" (turn ON all RSTs in Row "N"), begin interaction between "charge reservoirs" and "ADC+Counter".

2C. At the end of the pre-defined readout time, move data from counters to row "N: of "First-Table".

Repeat operation 2 for subsequent rows in turn.

Third Phase—Measurement of Photo-Current (Linear Gain)

Operation 3. Measure Photo-Current (Linear Gain) in Pixels of Row "N"

3A. Pre-select the ADC and digital counter in each column to operate in the voltage-to-time mode.

3B. Select Row "N" (turn ON all RSTs in Row "N").

3C. Apply suitable voltage to APD for measuring photo-current:

3C1. Apply negative potential at the top electrode (shared by all APDs). The pixels with RSTs turned OFF have an applied voltage whose magnitude is equal or less than the magnitude of this negative potential, which is not enough to provide avalanche conditions.

3C2. Apply positive potential at the column readout line. The APDs in the pixels with RSTs turned OFF are not affected by this positive potential.

3C3. The APDs in pixels with RSTs turned ON, are under a total applied voltage that is the sum of the negative and positive potentials, which is chosen for its suitability to measure photo-current with large linear avalanche gain.

3D. Measure photo-current with column ADC working in the voltage-to-time mode.

3E. Move data from counters to row "N" of "Second-Table".

Repeat operation 3 for subsequent rows in turn.

Fourth Phase—Edge/Pulse Detection (Geiger Mode)

Operation 4. Edge/Pulse Detection (Geiger Mode) in Pixels of Row "N"

4A. Set APDs of Row "N" and ADC to operate in the "Edge/Pulse Detection" mode.

4A1. Apply negative potential on top (common) terminal of all APDs (can be same as in 3C1).

4A2. Apply positive potential at the column line such that the voltage across the APDs of Row "N" is suitable for Geiger mode.

4B. Simultaneously do:

4B1. Emit light pulse in the suitable range of wavelengths (e.g., Short Wavelength Infra-Red).

4B2. Begin counting time using column "digital counter".

4C. Detection current step or pulse coming from APD, and stopping of column "digital counter".

4D. Move data from counters to row "N" of "Third-Table".

4E. De-selection of Row "N"

Repeat operation 4 for subsequent rows in turn.

Merge data from "First-Table", "Second-Table" and "Third-Table", into a new table with a suitable format.

4.2. Definition of "Sub-Frame" Method

It must be kept in mind that this scheme is only possible because the "Charge-Subtraction" ADC mode can subtract "packets of charge" from a charge reservoir, at the same time that more charges are being added to the same charge reservoir, and regardless of the number of packets of charge already accumulated in the charge reservoir (inside a pixel). This was defined as the "shutter-less" mode of operation of the ADC for data acquisition and transfer.

One "Sub-Frame" is a table of values, with a one-to-one correspondence with the matrix of pixels constituting the image sensor. In one Sub-Frame, each entry is the quantized partial value of intensity of light absorbed in the corresponding pixel (photo-diode). Each Sub-Frame has a "timing value" attached to it that may be used for 3-D imaging, and also for "deblurring" as it will explained below. All entries in the same Sub-Frame share the same "timing value". A complete frame is formed by adding the values of the entries for each pixel in a series of Sub-Frames that were acquired during a given time interval (the shutter interval). Conceptually, the number of bits for the entries of one Sub-Frame can be different from the preceding or the subsequent frames.

For the sake of simplicity it will be assumed that, during a readout cycle, only one "charge packet" is removed from each pixel, regardless of the total amount of "charge packets" stored in the pixel. In this particular case, the amount of the charge stored in each pixel can be produced by either a linear gain avalanche with very large gain, or by a non-linear gain avalanche (Geiger-mode).

With sufficiently fast readout processes, each pixel could operate in a completely digital fashion: the absorption of a photon generates a very large amount of charge stored at the in-pixel capacitor (for example the N-Well/P-Sub junction), and the readout process would only verify if a photon had been absorbed or not, by comparing the charge at the in-pixel capacitor with a threshold value (a reference charge at the capacitor Cref of the ADC).

This readout process is noiseless, provided that there is a clear difference between the stored charge generated by the absorption of a single photon and the hypothetical residual charges that may exist in the absence of photon absorption. It should be noticed that for this noiseless readout process, the avalanche photo-diode does not need to be operated in the non-linear gain mode (Geiger mode). This is advantageous because the lower electric filed applied to the avalanche photo-diode decreases the chances of false counts.

Readout Process for the "Sub-Frame" Method (Described in the Fluxogram of FIG. 13)

A complete frame made of Sub-Frames with all the pixels in the image sensor with 3D information for each pixel, can be obtained with the sequence of steps listed below.

First Phase—"Accumulation of Charges"
1. Light is absorbed in all pixels all the time (shutter-less).
2. All rows are de-selected (all RSTs are OFF)
3. Apply constant negative potential to top electrode of the APDs (shared by all APDs).

Second Phase—Readout of Row "N"
4. Pre-select column ADC and digital counters to operate in the charge-to-frequency mode. The time interval available for readout is suitable to subtract only one "packet of charges" from a pixel.
5. Turn ON all RSTs in Row "N", and begin interaction between "charge reservoirs" inside the pixels of Row "N", and column ADC & Counter.
6. At the end of the pre-defined readout time, move data from counters to a Table named "Sub-Frame_M".
7. Repeat Readout Sequence of Row "N" for all Rows At the end of the Second Phase, each table named "Sub-Frame_M" has the data values from all the pixels from all the rows, and is time-indexed. As outlined below a post-processing step can use the values of the time indices at which certain features of specific pixels where obtained to "de-blur" portions of an image.

4.3. Comparison Between "Full-Frame" and "Sub-Frame" Methods

The essential differences between the "Full-Frame" and Sub-Frame" methods of image acquisition are:
1. With Full-Frame method, for each pixel, the total time during which there is signal acquisition (the "integration time"), is a finite continuous interval of time, and therefore it is not known whether the rate of absorption, for all or just a subset of the pixels, changed during that time. The beginning and the end of the "integration time" are pre-defined and cannot be changed after image acquisition.
2. With the Sub-Frame method, for each pixel, the total "integration time" is sliced into very short time intervals, which with the suitable time-indexing of each of those "partial integration times", provides information on if and how the absorption rate changed. With the "Sub-Frame" method, a complete frame is produced by a sum of numerical terms, each term corresponding to a time-slice. For a fixed photon flux and absorption rate, shortening the time-slices, results in a sum with increasing number of terms that are smaller in value. Taking the Sub-Frame method to the limit, each Sub-Frame comprises an integration time so short that at most only one photon is absorbed during the time interval between Sub-Frames. In this case, all terms in the sum will be either zero or unity.

These two methods have different minimum ADC hardware requirements. The Full-Frame method requires the column digital counter to have a number of bits that, at least, matches the number of bits of the dynamic range, and/or Log(base2) of the number of clock cycles to be counted during the measurement of "Time-of-Flight". The Sub-Frame method requires only a 1-bit counter/register per column, but requires more on-chip and/or off-chip memory to save all the Sub-Frame tables necessary to produce a complete frame with the desired dynamic range and/or 3-D spatial resolution.

4.4. "Diaphragm-less" Imaging

In conventional analog or digital photography, it is necessary to take precautions to avoid saturation of the photo-absorbed signal. In conventional digital photography systems, this can be done by optimizing the settings of the shutter time and of the diaphragm. The diaphragm is used to limit the total amount of light impinging on the sensor (film or electronic).

The combination of the ADC disclosed in this document, working in conjunction with avalanche pixels (U.S. Pat. No. 6,943,051 B2, and PCT/EP2005/008182 (filed in 28 Jul. 2005), is able to cover the maximum intra-scene dynamic range possible in nature, without the use of a diaphragm.

In the present invention, the maximum dynamic range capable of being handled by the imaging system is expanded in different ways, depending on the image formation methodology.
1. In the Full-Frame methodology, very high photon fluxes are captured not in the "accumulation of charges" mode, which would saturate rather easily, but in the photo-current mode, with can have software-defined gain, depending on the intensity of the flux itself, and adjustable in real-time. Effectively, it is possible to define a pixel-level variable sensitivity (avalanche gain defined on a per-pixel basis).
2. In the Sub-Frame methodology, all photon fluxes are captured in the accumulation of charges mode, but with a shutter-less system, and a fast enough readout process, it is possible to resolve all photon arrivals, and capture the full dynamic range from natural illumination.

4.5. Special Properties of the Sub-Frame Image Formation Method

With the Sub-Frame method described in this document, the definition of "shutter time" or "shutter window" is radically different from the definition in conventional Full-Frame method. With the Sub-Frame method, photo-absorption is always taking place (shutter-less process), and readout proceeds simultaneously with photo-absorption. The readout process uses the ADC in the "Charge-Subtraction" mode, in which a number of "charge packets" are allowed to be subtracted from each pixel, regardless of the total amount of "charge packets" accumulated in that same pixel.

One of the most important advantages of the Sub-Frame method, is the possibility to arbitrarily include or exclude certain data points (Sub-Frames) from the final result (a single Frame). This is extremely important because it also allows the extremes of the integration interval to be shifted, after the image is acquired.

Typically, any analog image acquisition system has readout/quantization errors. However, with avalanche gain, it is possible to completely offset the quantization errors and essentially have a noiseless readout/quantization process. This is achieved through a combination of high gain, producing hundreds or thousands of electrons per absorbed photon, and an in-pixel "charge reservoir" with small capacitance. This effect can also be achieved by a non-linear gain avalanche (Geiger mode).

With sufficiently fast readout processes, each pixel can operate in a completely digital fashion: the absorption of a photon generates a very large amount of charge stored at the in-pixel capacitor, and the readout process would only verify if a photon had been absorbed or not, by comparing the charge at the in-pixel capacitor with a threshold value (a reference charge at the capacitor Cref of the ADC). This readout process is noiseless, provided that there is a clear difference between the stored charge generated by the absorption of a single photon and the hypothetical residual charges that may exist in the absence of photon absorption.

If the readout cycle for all the rows is faster than the rate of arrival of photons at one individual pixel, no signal will be lost. The total cycle time is given by the product of the number of row-select lines by the time that is takes to subtract one "charge packet" from a pixel. Ideally the total cycle time should be as short as possible, which can be reduced by reducing the number of row-select lines and/or reducing the time it takes to subtract one "charge packet" from a pixel. The number of row-select lines in a readout cycle can be reduced by demultiplexing the number of row-select lines in a matrix, by adding more column data lines in parallel from the matrix to the periphery. PCT/EP2005/008182 (filed in 28 Jul. 2005) shows how this can be achieved with more metallization layers for both frontside and back-side illuminated image sensors.

With this readout scheme, when a certain row-select line is selected, the respective RSTs are turned ON, and if the stored charge inside the respective pixel is larger than the threshold value set at the column ADC, then there is a transition at the output of the column ADC, and one packet of charge is removed from that pixel. The digital control unit 116 in each column monitors the output of the ADC, and when there is a transition, the controller sends that information to a peripheral controller that keeps (on-chip buffer) an "index table". The index table is a one-bit deep matrix, with a number of rows and columns identical to the image sensor matrix. The one-bit deep matrix is called a Sub-Frame, that is identified by the time when it was generated (one-bit image acquisition). A Sub-Frame is generated by performing the one-bit readout process for each row-select line.

4.5.1. Data Handling & Storage

The Sub-Frame method is prone to generate vast amounts of data, and therefore it is mandatory to handle that data in a way such that the methodology is feasible to implement without requiring extraordinary hardware and/or software resources. One possibility is to perform spatial compression independently for each Sub-Frame, and store in off-chip memory only the compressed data. It is possible to go one step further and perform also time compression. The following two sequences provide exemplary ways to perform combined spatial and/or time compression of the Sub-Frames:

Sequence of Steps for Spatial Compression of Individual Frames, Followed By Difference to Previous Frame For an implementation minimizing the on-chip hardware resources, data can be compressed as it is transferred from the ADC to a table, storing only the already compressed data.

A. Read data of "Row N" from ADC.
B. Move data through the "data compression logic circuitry". This architecture is highly suitable for simple linear compression schemes such as Run-Length-Encoding (RLE).
C. Store output of "data compression logic circuitry" to "Table".
D. Compute the difference between the current compressed table, and the previous one.
E. Move and store "difference of compressed tables" to off-chip memory.

It is possible to have several slightly different variations of the sequence above. For example, it is possible to introduce some degree of parallelism by simply grouping a number of columns that are connected to a single "data compression logic circuitry" unit, and have several "data compression logic circuitry" units operating in parallel.

Of particular interest are 1-bit deep Sub-Frames, in which case that the maximum dynamic range possible with this method is given by logarithm (base2) of the sum of the all the signals (for the same pixel) of all Sub-Frames. For 1-bit Sub-Frames that number is identical to logarithm (base2) of the maximum possible number of Sub-Frames. For example, a dynamic range of 16-bit requires the storage of $2^{16}$ (65,536) independent 1-bit deep tables (compressed or uncompressed).

The maximum number of Sub-Frames is given by the total time available for the acquisition of a Full-Frame, multiplied by the maximum rate of acquisition of Sub-Frames. The maximum 1-bit Sub-Frame rate is inversely proportional to the time that it takes to subtract one "charge packet" from a single pixel, multiplied by the number of row-select lines (which may, or may not, be identical to the number of rows).

4.5.2. Dynamic Range and Resolution

The worst-case scenario for the image acquisition using the Sub-Frame method, is for the sensor matrix to be exposed to the maximum light intensity possible to occur in nature, such as pointing directly towards the Sun. Without artificial illumination, the maximum intra-scene dynamic range that can occur is the difference between a totally dark pixel (zero photon flux), and staring directly at the Sun. Staring directly at the sun results in a photon flux of $120 \times 10^6$ $\mu m^{-2} s^{-1}$, which corresponds to about $2^{27}$ $\mu m^{-2} s^{-1}$, thus resulting in a DNR=27-bits $\mu m^{-2} s^{-1}$.

For pixels with 1 $\mu m^2$ area, and for a sensor with 1000 rows, this means that the time interval available to select a row of pixels and subtract one packet of charges, is given by:

$$[(12 \times 10^7 s^{-1} \ \mu m^{-2}) \times (1 \ \mu m^2) \times (1000)]^{-1} = 8.3 \times 10^{-12} s$$

That is 8.3 pico-seconds per row. This is the worst-case scenario, and under typical conditions the sensor is not staring directly into the Sun, and the photon flux is many orders of magnitude smaller this. For example for a dynamic range of 20 bits (~$10^6$ levels), the time interval available for each row is 1 nano-second:

$$[(10^6 s^{-1}\ \mu m^{-2}) \times (1\ \mu m^2) \times (1000)]^{-1} = 10^{-9} s$$

With 1 $\mu m^2$ pixels, a Sub-Frame-rate of 120 MHz (each Sub-Frame being 1-bit deep), and a "complete frame" rate of 50 Hz (progressive scanning), the maximum dynamic range is found to be $(120 \times 10^6)/50 = 2.5 \times 10^5$ which is nearly 18 bits.

With 1 $\mu m^2$ pixels, a Sub-Frame rate of 1 MHz (each Sub-Frame being 1-bit deep), and a "complete frame" rate of 50 Hz (progressive scanning), the maximum dynamic range is found to be $(100 \times 10^4)/50 = 2 \times 10^4$ which is only slightly more than 14 bits.

These calculations indicate that the limitation to the dynamic range comes from the bandwidth between the pixels and the periphery of the matrix, that is, from the Sub-Frame rate and number of rows. For example, for the 120 MHz Sub-Frame rate, the 27 bit dynamic range at the pixel level is reduced to 18 bit for 1000 row matrix for a frame rate of 50 Hz. For the same frame rate, a matrix with 8 times less rows could increase the Sub-Frame rate by a factor of 8, to 960 MHz, and the dynamic range would increase by 3-bits, to 21 bits.

Bandwidth (as defined by the number of bits acquired or transferred per unit of time) can be increased by reducing the time interval required to read all the rows in the sensor matrix. The reduction of the time interval can be accomplished in several ways:

1. Reduce the number of rows, which for a fixed size of the sensor (tied to the optical circle produced by the lens system), means reducing the number of pixels by increasing pixel size. However this would result in a larger number of photons impinging on each pixel per second.
2. Reduce the time interval for the readout process of each row (row selection and subtraction of charge packet from pixel). This can be done by using faster CMOS devices (more advanced CMOS process technology) for the pixel, for the ADC, and for the periphery circuitry.
3. Use layout schemes, at the pixel level and at the whole matrix level, to enable the demultiplexing of rows of pixels allowing several rows of pixels to communicate in parallel with the sensor matrix periphery. This can be done by, for example, increasing the number of metal levels, as described in the PCT/EP2005/008182, filed in 28 Jul. 2005.

4.5.3. "Shutter-Less" Imaging

As already said, tith the Sub-Frame method the definition of "shutter time" (or "shutter window") is radically different from the same notion in a conventional system. With the Sub-Frame method, photo-absorption is always taking place (shutter-less process), and the readout process takes place simultaneously with photo-absorption. This is possible for two following reasons:

A. An ADC that is capable to interacting with the pixels while photo-absorption is taking place.
B. The Sub-Frame method allows the definition of what constitutes a frame to be done after the image has been acquired.

The readout process uses the ADC in the "Charge-Subtraction" mode, in which a number of "charge packets" is allowed to be subtracted from each pixel, regardless of the total amount of "charge packets" accumulated in a pixel. A special case is when during a readout cycle, only one "charge packet" is removed from each pixel, regardless of the total amount of "charge packets" stored in the pixel.

A shutter-less system is extremely important for very low light conditions in which the photon flux is very low. With a shutter-less system there is no danger of defining a too short or a too long shutter time. With a shutter-less system there is no danger of missing the arrival of a single photon. With a shutter-less system, image acquisition (still and video) can be always "ON".

4.5.4. "Deblurring"

In a conventional Full-Frame imaging system, moving objects can cause "blur". Blurring occurs when the speed of the moving objects is such that during the pre-defined integration time, the spatial envelope of the moving objects shifts across the 2D focal plane, and consequently across several adjacent pixels in the 2D sensor matrix. Blurring can be reduced by decreasing the spatial shift across the 2D sensor matrix, which can be done by decreasing the integration time. Blurring can be completely avoided by having an integration time during which the moving objects do not shift across the 2D sensor matrix. However complete suppression of blurring in conventional Full-Frame imaging systems presents the following problems:

1. The optimal shutter interval depends on the speed of the fastest moving objects being captured.
2. In typical situations, the speed of the moving objects is not known before image acquisition, and therefore it is impossible to set the optimal shutter time before the images are acquired.
3. In typical situations the moving objects change speed over time, thus requiring either constant adjustment of shutter time or setting shutter time to shortest possible.
4. Setting the shutter time to the shortest possible, leads to a decreased dynamic range, and thus decreased image quality.

The Sub-Frame method has the potential for completely new image formation capabilities. For example, there is no need to define "a priori" a shutter time, nor to define "a priori" the start and end points of a "frame". These parameters can be defined "a posteriori", because every single Sub-Frame is also time-indexed (in fact, simple numbering), thereby allowing the arbitrary (after image acquisition) definition of, 1. The start and end points of a frame.
2. "Shutter time".
3. Which Sub-Frames are included in the final complete frame.

The definition "a posteriori" of which Sub-Frames are included in the definition of a complete frame, enables the trade-off between dynamic range and blurring, because deblurring involves the "exclusion" of a number of Sub-Frames, which in turn decreases the maximum dynamic range. This is so because deblurring is based on the shutter-less process described above, which in turn performs image capture through the "accumulation of charges" process, in which the dynamic range is proportional to the integration time, or in this case to the number of Sub-Frames.

The "exclusion" of certain Sub-Frames can be accomplished by shifting the "boundaries" between consecutive frames, the creation of more frames, or simply the complete exclusion of the undesired Sub-Frames from all frames in the frame stream. For still images, without moving objects, blurring does not occur, and this trade-off does not have to be made, thereby allowing the dynamic range to increase with time of image acquisition.

For example, for a frame rate of 100 Hz, there is at most 10 ms of acquisition time for each frame. Assuming that the time necessary to subtract a "charge packet" from one pixel is 100 ps or less, and for a matrix with 1000 row-select lines, one has: 10 ms/(1000×100 ps)=10 ms/100 ns=100K (more than 16-bit). A 16-bit dynamic range compares very favorably with conventional CCDs and CMOS image sensors, of which a few reach 14-bit, and typically have a dynamic range below 12-bit.

Because each Sub-Frame is time-indexed, it is possible to remove selected Sub-Frames from being included in the formation of the Full-Frame. This enables a completely new possibility: a frame containing blurred fast moving objects can be "un-blurred" by removing Sub-Frames (presumably the first and/or the last ones to be acquired) until the blurring disappears. Furthermore, it is possible to remove only the pixels containing the fast moving object, thereby still allowing the maximizing the dynamic range of the non-moving objects or the "background".

4.5.5. Signal Tracking

A. Tracking of Moving Objects

From the comments about the suppression of blurring through the "a posteriori" definition of which Sub-Frames are part of the sum that produces a complete frame, it follows that it is straightforward to infer if there are moving objects, in which case it is also straightforward to track their motion across the 2-D focal plane (2-D sensor matrix). With the Sub-Frame method, the tracking of moving objects can easily be accomplished by simply subtracting sequential "de-blurred" complete frames.

B. Tracking of Variation in Light Intensity

It is also possible to distinguish between actual moving objects from simple variation in light intensity from stationary objects. Variations in light intensity from stationary objects do not produce blurring. In this case the changes always occur with the same color pixels (composed of a subpixel for each primary color). In other words, the addresses of the color pixels that have changes in signal intensity do not change from one Sub-Frame to another, or from one de-blurred complete frame to another.

C. Tracking of Changing Color Signature

Changes in the color signature of a static object can also be detected by monitoring if there are any changes in the values of the subpixels for each primary color, while there are no changes in the addresses of the full color pixels, from one Sub-Frame to another, or from one de-blurred complete frame to another. This monitoring also prevents blurring from a change in color signature of a static object because the Sub-Frames are made of the matrix containing the subpixels for each of the primary colors. Therefore any change in those subpixels can be used to define a different "de-blurred" complete frame.

4.5.6. "Sub-Frame" Method and 3-D Imaging

Distance from the point of observation to objects, can be determined through the "Time-Of-Flight" (TOF) method. This TOF method consists in measuring the time delay between the moment when photons were emitted from the point of observation, towards the objects whose image is being acquired and the moment when the image sensor detects the photons reflected back at the observation point. This time is captured by a timer (implemented as a binary counter), which is started at the time when the photons are emitted and stopped when the image sensor detects the reflected photons.

With this TOF method, photons make a round trip, and thus travel a distance that is twice that between the objects themselves and the point of observation. Given that the speed of light is a well known constant, the distance to the objects is then found by the following simple formula: $S=0.5 \times V \times T$, where "S" is space, "V" is the speed of light, and "T" is time. For example, and a measured time of flight of $T=1$ µs would correspond to an object that is 150 meters away from the observation point since $V=3 \times 10^8$ meters/sec, and for $T=1$ µs, S is $0.5 \times 3 \times 10^8 \times 10^{-6} = 150$ meters.

The spatial resolution of the measured distance is determined by the "time resolution", that is, by the minimum time interval possible to count (related to the frequency of the reference clock). Assuming that the minimum increment possible for T is 1 ns, then the granularity in distance is 0.15 m (15 cm).

This TOF method can be applied adaptively to create tri-dimensional (3D) imaging capabilities as follows. If during the time a given row of pixels is selected, the APD does not detect a single photon, the counter is not stopped until a reset signal marks the de-selection of that row. This means that the objects were either too far or non-existent. Increasing the time period during which a row is selected enables the detection of more distant objects. At the same time, choosing shorter time intervals during which a row is selected, provides a filtering mechanism that excludes objects whose distance is larger than the threshold set by the time allowed for the absorption of reflected photons.

3-D Imaging through the TOF technique can also be implemented with the Sub-Frame method of image formation. Distance from the point of observation (location of image sensors and light source) to a given object in the field of view can be determined by measuring the time interval between when photons are emitted from the light source, until they are detected by the image sensor.

With the Sub-Frame method of image formation, the TOF technique can be implemented in the following manner:
1. Emission of light pulse, and start counting time (see previous description of this process above);
2. Immediately start readout process, sequentially for all rows in the sensor matrix;
3. When the readout of a given pixel indicates that photons have been detected, read and save the value of the clock at that instant;

The time delay "dT" between two consecutive readout steps for the same pixel, is the time necessary to perform the readout process for all the rows, what could be called the "cycle time". This delay "dT", is the limiting factor in the spatial resolution "dS" of the TOF technique implemented with the Sub-Frame method of image formation. The relation between the delay dT and spatial resolution dS is given by the formula: $dS=V \times 0.5 \times dT$. For example, with $dT=10$ ns, one has $dS=1.5$ meters. The maximum spatial resolution is given by the time it takes to do consecutive readouts of the same pixel. Higher Sub-Frame rates result in higher spatial resolution.

From the description in the paragraph above it follows that this method benefits from implementations using advanced CMOS technology, which allows smaller pixels, and can improve the readout speed, thereby improving the bandwidth. It should be noted that with conventional architectures, the performance of analog circuits suffers with CMOS scaling because of the inevitable scaling of the voltage supply. With the Sub-Frame architecture, the performance actually increases with CMOS scaling due to the "digital nature" of the in-pixel charge storage and readout process.

Faster readout cycles can be achieved with special layout structures that increase the bandwidth between the pixels and the ADC (PCT/EP2005/008182, filed in 28 Jul. 2005).

In particular, a special layout can be devised to provide the increased bandwidth just for the pixels involved in the "time of flight" measurements. The time interval necessary to perform the readout process for all rows, determines the maximum spatial resolution possible.

For this purpose it is also very important to increase the bandwidth between the sensor matrix and the periphery. Making use of additional metallization levels, according to PCT/EP2005/008182, filed in 28 Jul. 2005, is one of the best ways to increase the general bandwidth between the sensor matrix and the periphery. It is also possible to increase the bandwidth asymmetrically, so that more is available to the pixels used for TOF calculations (for example the ones with IR filters), and less to the normal RGB pixels.

4.6. Photo-Current & Shutter-Less Operation

The key issue with measurements of flux (photo-current) is that they require "Electronic Rolling Shutter" type of readouts. This can be changed with more in-pixel circuitry and/or dense back-side interconnects that would enable the measurements of photo-currents with a "Electronic Global Shutter". The problem with the Electronic Rolling Shutter are two-fold:

The distortion caused by the delay between the measurement of the first and the last rows of the pixel matrix, which is especially relevant when there are fast moving objects in the field of view;

Significant change in photo-flux impinging on the pixel matrix while the readout process is taking place. For image acquisition through time-integration schemes, this is not relevant. However this is very problematic when the readout of one or more rows started with a low photo-flux, and before the entire pixel matrix is readout, the photo-flux has an appreciable increase, or vice-versa. This would result in an image with a gradient in light intensity from the top to bottom.

The invention claimed is:

1. An analog-to-digital converter (ADC) apparatus for analog source signals of one polarity, comprising one comparator (111) consisting of transistors T2, T3, T4, T5 and T6, pass transistors T1 & T10, a block of digitally addressable voltage sources (113) to set the reference voltage (Vref) of the comparator (111), asynchronous n-bit digital counter (114), a block of digitally addressable voltage sources (115) to set the potential to be applied to the signal source, a digital control unit (116), a block (117) storing the calibration data for the input capacitor (Cref) of the comparator (111), and a base-2 multiplier block (118), being interconnected by the following branches or lines: line (121) connecting the input analog signal (source signal) to the drain of pass transistor T1, line (124) connecting the source of T1 to the source of T3, and to the block of voltage sources (115) to be connected to the signal source, line (123) connecting the digital control unit (116) to the gates of T1, T2, T3, T4, T7, and drain of T10, line (122) carrying the signal Vref from the block of digitally addressed voltage sources (113) to the source of transistor T2 of the comparator (111), line (126) connecting the digital control unit (116) to the gate of T10, line (125) connecting the output of the comparator (111) to the digital control unit (116) and the source of T10, group of lines (127) connecting the digital control unit (116) to the gates of the pass transistors in block of digitally addressable voltage sources (115) to set the potential to be applied to the signal source, group of lines (132) connecting the digital control unit (116) to the gates of the pass transistors in the block of digitally addressable voltage sources (113) to set the signal Vref for the source of transistor T2 inside the comparator (111), one or several lines (133) connect the output of the asynchronous n-bit digital counter (114) to the digital control unit (116), line (134) connecting the digital control unit (116) to the asynchronous n-bit digital counter (114), to provide a "Reset" signal, line (135) connecting the digital control unit (116) to the asynchronous n-bit digital counter (114), to provide an "Enable" signal, line (136) connecting the digital control unit (116) to the input of the asynchronous n-bit digital counter (114), to provide said input with either the output signal (125) of the comparator (111), or an oscillating signal, such as that provided by a "ring oscillator" (137), one or several lines (128) connecting the digital control unit (116) to the block (117) storing the calibration data for the input capacitor (Cref) of the comparator (111), one or several lines (129) connect the digital control unit to the (116) to the base-2 multiplier (118), one or several lines (130) connecting the block (117) storing the calibration data for the capacitor Cref, to the base-2 multiplier (118), group of lines (131) providing access to the output of the base-2 multiplier (118), that is, to the binary value corresponding to the analog input signal.

2. An analog-to-digital converter (ADC) apparatus for analog source signals of both polarities, comprising two comparators (111+ & 111−), consisting of transistors T2+, T3+, T4+, T5+ and T6+ and transistors T2−, T3−, T4−, T5− and T6−, respectively, four pass transistors (T1−, T1−, T10+ & T10−), two blocks of digitally addressable voltage sources 113+ & 113− to set the reference voltages Vref+ & Vref− respectively of the comparators 111+ & 111−, two asynchronous n-bit digital counters (114+ & 114−), two blocks of digitally addressable voltage sources (115+ & 115−) to set the potential to be applied to the signal source, a digital control unit (116), two blocks (117+ & 117−) storing the calibration data for the input capacitors Cref+ & Cref− respectively of the comparators (111+ & 111−), and two base-2 multiplier blocks (118+ & 118−), being interconnected by the following branches or lines: line 121+ (121) connecting the source signal to the drain of pass transistor T1+ (T1−), line 124+ (124−) connecting the source of T1+ (T1−) to the source of T3+ (T3−), and to the block of voltage sources 115+ (115−) to be connected to the signal source, line 123+ (123−) connecting the digital control unit 116 to the gates of T1+ (T1−), T2+ (T2−), T3+ (T3−), T4+ (T4−), T7+ (T7−), and drain of T10+ (T10−), line 122+ (122−) carrying the signal Vref+ (Vref−) from the block of digitally addressed voltage sources 113+ (113−) to the source of transistor T2+ (T2−) of the comparator 111+ (111−), line 126+ (126−) connecting the digital control unit 116+ (116−) to the gate of T10+ (T10−); line 125+ (125−) connects the output of the comparator 111+ (111−) to the digital control unit (116) and the source of T10+ (T10−), group of lines 127+ (127−) connecting the digital control unit 116 to the gates of the pass transistors in block of digitally addressable voltage sources 115+ (115−) to set the potential to be applied to the signal source, group of lines 132+ (132−) connecting the digital control unit 116 to the gates of the pass transistors in the block of digitally addressable voltage sources 113+ (113−) to set the signal Vref+ (Vref−) for the source of transistor T2+ (T2−) inside the comparator 111+ (111−), one or several lines 133+ (133−) connecting the output of the asynchronous n-bit digital counter 114+ (114−) to the digital control unit 116, line 134+ (134−) connecting the digital control unit 116 to the asynchronous n-bit digital counter 114+ (114−), to provide a "Reset" signal, line 135+ (135−) connecting the digital control unit 116 to the asynchronous n-bit digital counter 114+ (114−), to provide an "Enable" signal, line 136+ (136−) connecting the digital control unit 116 to the input of the asynchronous n-bit digital counter 114+ (114−), to provide said input with either the output signal 125+ (125−) of the comparator 111+ (111−), or an oscillating signal, such as that provided by a "ring oscillator" (137), one or several lines 128+ (128−) connecting the digital control unit 116 to the block 117+ (117−) storing the calibration data for the input capacitor Cref+ (Cref−) of the comparator 111+ (111−), one or several lines 129+ (129−) connecting the digital control unit to the 116 to the base-2 multiplier 118+ (118−), one or several lines 130+ (130−) connecting the block 117+ (117−) storing the calibration data for the capacitor Cref+ (Cref−), to the base-2 multiplier 118+ (118−), one or several output lines 131 providing the unified binary data stream, combining the binary streams generated by blocks 118+ & 118−.

3. The analog-to-digital converter (ADC) apparatus of claim 1 minus blocks 117 and 118, in which said block 118 may be interfaced with several ADCs operating in parallel, and in which said block 117 may be part of a table or array of such blocks from several ADCs operating in parallel.

4. The analog-to-digital converter (ADC) apparatus of claim 2 minus blocks 117+ & 117−, and 118+ and 118−, in which said blocks 118+ & 118− may be interfaced with several ADCs operating in parallel, and in which said blocks 117+ & 117− may be part of a table or array of such blocks from several ADCs operating in parallel.

5. Method of analog to digital conversion using the ADC of claim 1, operating in a "charge-to-frequency" or "charge-subtraction" mode, in which the input capacitor Cref of the comparator (111) is used to subtract a set of charges from the signal source, and the asynchronous n-bit digital counter (114) records how many sets of charges are subtracted, the method comprising the following steps A through I:
  A. Initialization by resetting/pre-loading of comparator: the digital control unit (116) commands through line 123 the gates of T1 and T3 to be turned OFF, while the gates of T2 and T4 are turned ON, thereby pre-loading the capacitor Cref with the value Vref,
  B. Quantization operation begins with the digital control unit (116) turning ON transistor T10,
  C. The digital control unit (116) turns OFF all voltage sources that are controlled by lines (127),
  D. The digital control unit (116) sets line (123) to a state such that the gate of T1, T2, T3 and T4 follow the output (125) of the comparator (111), when this happens, T1 and T3 are turned ON, while T2 and T4 are turned OFF,
  E. With T1 and T3 turned ON, if the source signal is larger than the value Vref that the capacitor Cref was pre-loaded with, there will be a transition at the output (125) of the, comparator (111)
  F. A transition a the output (125) of the comparator (111), while T10 is ON, turns T1 & T3 OFF and turns T2 & T4 ON, thereby reloading (resetting) the capacitor Cref with the value Vref,
  G. Once Cref is re-loaded with Vref, the output (125) of the comparator (111) experiences another transition, thereby initiating another quantization cycle in which another set of charges are removed by the capacitor Cref from the signal source,
  H. The digital counter (114) records the number of transitions occurring at the output (125) of the comparator (111), and
  I. When the digital control unit (116) senses that the output (125) of the comparator is no longer experiencing transitions, or when an external control signal commands it, the quantization process is declared complete, and the digital control unit (116) retrieves the value recorded by the digital counter (114), and makes it available at the output of the ADC (137).

6. Method of analog to digital conversion using the ADC of claim 1, operating in a "voltage-to-time" or "voltage extrapolation" mode, in which the input capacitor Cref of the comparator (111) is exposed to the source signal, and from its partial charging an extrapolation is made about the actual value of the source signal, the method comprising the following steps A through N:
  A. The digital control unit (116) turning OFF transistor T10,
  B. The digital control unit (116), through lines 132, selects the source with the lowest value of Vref,
  C. Initialization by resetting/pre-loading of comparator: the digital control unit (116) commands through line 123 the gates of T1 and T3 to be turned OFF, while the gates of T2 and T4 are turned ON, thereby pre-loading the capacitor Cref with the value Vref,
  D. The digital control unit (116), through lines (127), turns ON the voltage source inside block (115) connected to the largest voltage presumed to elicit a linear response from the signal source,
  E. The digital control unit (116) turns ON transistors T1 & T3, which at the same time turns OFF transistors T2 & T4, thereby exposing the capacitor Cref to the source signal,
  F. Simultaneously trigger the digital counter (114) to count time, by feeding its input with an oscillatory signal with a known and well defined time period,
  G. If/when the source signal is/becomes larger than the value Vref, which Cref was preloaded with, there is a transition at the output (125) of the comparator (111),
  H. When the digital control unit (116) senses a transition at the output (125) of the comparator (111), it stops the digital counter (114),
  I. If the value registered by the digital counter (114) is judged to be too small:
    If "Yes", repeat the sequence of steps from (B) to (H), with a larger Vref being selected at step (B),
    If the value registered by the digital counter (114) is judged to be too small, even with the largest Vref possible, then the sequence of steps from (B) to (H) should be repeated with, having selected the largest Vref at step (B), and at step (D) selecting inside block (115) the voltage source with the value that is immediately below the was previously chosen,
    If "No", go to next step,
  K. The digital control unit (116) reads out the value registered by the digital counter (114), sends the value to the base-2 digital multiplier (118), commands block (117) to send the stored calibration data of capacitor Cref to the base-2 multiplier (118),
  L. Base-2 multiplier computes, using the extrapolation algorithm, the actual value of source signal from the value registered by the digital counter (114) and from the calibration data of Cref (117),
  M. Transfer of the computed value by the base-2 multiplier (118) to an external storage block, such as a data table, and
  N. Repeat steps (B) through (M) for any further quantization processes of the source signal.

7. Method of analog to digital conversion using the ADC of claim 1, in which the mode of operation can be software-configured in real-time.

8. An image sensing system in which the ADC of claim 3 is used as column circuitry ("Column ADC") 143 and 144 of a CMOS image sensor comprising a matrix of avalanche pixels 140, each comprising one avalanche photo-diode (APD) and one Row-Select Transistor (RST), a matrix controller (141) as well as a logic unit comprising a run length encoder (142), table (145) with Cref calibration data for ADCs of blocks 143 & 144, one or more base-2 multiplier (146), a timing table (147) for 3D imaging, and a number n of bit planes (148*a* to 148*n*), to be used in the Sub-Frame method of image formation.

9. Method for image acquisition and readout using the imaging sensing system of claim 8, in which analog to digital conversion is used to readout the light intensity signal from each pixel, when the pixel matrix is operated in a "Global Shutter" mode, comprising the following steps A through F, grouped into "signal acquisition" and "readout process", which are repeated until all rows have been selected and all pixels have interacted with the ADC:

Signal acquisition by:
A—Pre-definition of "integration time" or "shutter window" for all pixels in the sensor matrix,
B—Pixels absorb light and store charge during the "integration time", simultaneously for the entire sensor matrix, The "integration time" is set by the width of a voltage pulse that is applied to all photo-diodes in parallel, and whose amplitude defines the avalanche gain, The voltage pulse in question is applied to the terminal that is common to all photo-diodes in the sensor matrix, Readout process by:
C—Selection of a Row,
D—Enable direct interaction between "charge reservoir" (capacitor) inside the pixel of selected row and the ADC. The ADC will be operating in the "Charge-Subtraction" mode, in which it subtracts a pre-defined amount of charge from the pixel, and counts how many times that pre-defined amount of charge was subtracted from the pixel. The amount of charge to be subtracted can be modified through software control,
E—The time interval during which there is a direct interaction between a pixel and the ADC is software-programmable,
F—When the pre-defined time interval for direct interaction between a pixel and the ADC is exhausted, there is de-selection of N-Row, and selection of another Row.

10. Method for image acquisition and readout using the imaging sensing system of the claim 8, in which digital conversion is used to readout the light intensity signal from each pixel, when the pixel matrix is operated in a "Rolling Shutter" mode, comprising the following steps A through H, repeated until all rows have been selected
A—Selection of N-Row,
B—From the ADC, apply maximum voltage setting to the bottom terminal of the APD,
C—Verify that there is no current saturation (linear avalanche mode),
D—If there is current saturation, select the voltage level immediately below the one just used,
E—Repeat C & D, until there is no saturation of avalanche current,
F—Measure voltage drop with ADC operating in "Voltage-Extrapolation" mode,
G—De-selection of N-Row, and
H—Selection of (N+1)-Row.

11. Method for image acquisition and readout using the imaging sensing system of claim 8, in which analog to digital conversion is used to readout the timed edge/pulse signal from each pixel, when the pixel matrix is operated in a "Rolling Shutter" mode, comprising the following steps A through E, repeated until all rows have been selected:
A—a Row is selected,
B—Photons are emitted from the point of observation,
C—"Column counters" start counting time,
D—When the APD of a given pixel generates a large photo-current, it stops the respective column counter, and
E—De-selection of N-Row, and selection of another Row.

12. Method for image acquisition and readout using the imaging sensing system of claim 8, in which analog to digital conversion is used to readout the signal from each pixel, simultaneously while the entire pixel matrix absorbing light, thereby having the entire imaging system operating in a "Shutter-less" mode, comprising the following steps A through F:
A—Light can be absorbed at all the time (shutter-less), by all pixels in the sensor matrix,
B—Readout is continuously performed (row by row) for all pixels of the sensor matrix,
C—Selection of N-Row for a predetermined amount of time—"Readout Window",
D—During the "Readout Window", in each column a single pixel interacts directly with the column ADC in the "Charge-Subtraction" mode, and the "Readout Window" limits the maximum number of "packets of charge" that can be subtracted by the ADC from the charge reservoir inside the pixel,
E—Each "packet of charge" that is subtracted from the charge reservoir inside a pixel, causes a change of state at the output of the ADC, which in turn drives the n-bit digital counter asynchronously, and
F—The "Readout Window" is software-programmable, and the end of a "Readout Window" leads to the selection of another Row, and readout of the respective pixels.

13. Method of image formation, the "Full-Frame" method of "Sequence A", utilizing the image sensing system of claim 8 of the present invention, and comprising the following steps A through X, grouped into 2 principal phases and 4 main operations:

First-Phase—"Accumulation of Charges"
Operation 1. Accumulate Charges in pixels for all Rows of the pixel matrix:
A—Define "Electronic Global Shutter" window (integration time),
B—All rows are de-selected (all RSTs are OFF),
C—Apply negative voltage pulse at the common top electrode of the APDs, The pulse width (duration of the pulse) defines the shutter window, Second Phase—Row-by-Row Readout of Accumulated Charges+ Measurement of Photo-Current with Linear Gain– Edge/Pulse Detection for Geiger mode,
Operation 2. Readout of Accumulated Charges in pixels of Row "N":
D—Pre-select the ADC and digital counter in each column to operate in the charge-to-frequency mode, and define also the time interval available for readout,
E—Select Row "N" (turn on all RSTs in Row "N"), to begin the interaction between "charge reservoirs" and "ADC+ Counter",
F—At the end of the pre-defined readout time, move data from counters to row "N" of "First-Table",
Operation 3. Measure Photo-Current (linear gain) in pixels of Row "N":
G—Pre-select the ADC and digital counter in each column to operate in the voltage-to-time mode, H—Select Row "N" (turn ON all RSTs in Row "N"),
I—Apply suitable voltage to APD for measuring photo-current:
J—Apply negative potential at the top electrode (shared by all APDs), The pixels with RSTs turned OFF have an applied voltage whose magnitude is equal or less than the magnitude of this negative potential, which is not enough to provide avalanche conditions,
K—Apply positive potential at the column readout line, The APDs in the pixels with RSTs turned OFF are not affected by this positive potential,
L—The APDs in pixels with RSTs turned ON, are under a total applied voltage that is the sum of the negative and positive potentials, which is chosen for its suitability to measure photo-current with large linear avalanche gain,
M—Measure photo-current with column ADC operating in the voltage-to-time mode,
N—Move data from counters to row "N" of "Second-Table",
Operation 4. Edge/Pulse Detection (Geiger) in pixels of Row "N":
O—Set ADC to measure Time-Of-Flight (TOF),
P—Apply negative potential on top (common) terminal of, all APDs,
Q—Apply positive potential at the column line such that the voltage across the APDs of Row "N" is suitable for Geiger mode,
—Simultaneously do:
R—Emit light pulse in the suitable range of wave lengths,
S—Begin counting time using column "digital counter",
T—Absorption of at least one photon induces a large current/voltage swing at the APD, which stops the column "digital counter",
U—Move data from counters to "Third-Table",
V—De-selection of Row "N",
W—Repeat Operations 2 through 4 for subsequent rows, and
X—Merge data from "First-Table", "Second-Table" and "Third-Table", into a new table with a suitable format.

14. Method of image formation, a "Full-Frame" method of "Sequence B", utilizing the image sensing system of claim 8, grouped into 3 principal phases and 4 main operations:
First-Phase—"Accumulation of Charges"
Operation 1. Accumulate Charges in pixels for all Rows of the pixel matrix:
A—Define "Electronic Global Shutter" window (integration time),
B—All rows are de-selected (all RSTs are OFF),
C—Apply negative voltage pulse at the common top electrode of the APDs, The pulse width (duration of the pulse) defines the shutter window,
Second Phase Row-by-Row Readout of Accumulated Charges
For each row of the pixel matrix perform the following operations:
Operation 2. Readout of Accumulated charges in pixels of Row "N":
D—Pre-select the ADC and digital counter in each column.to operate in the charge-to-frequency mode, and define also the time interval available for readout,
E—Select Row "N" (turn ON all RSTs in Row "N"), begin interaction between "charge reservoirs" and "ADC+ Counter",
F—At the end of the pre-defined readout time, move data from counters to row "N" of "First-Table",
G—Repeat operation 2 for subsequent rows, Third Phase—Measurement of Photo-Current (Linear Gain)+ Edge/Pulse Detection (Geiger mode)
For each row of the pixel matrix perform the following Operations 3 and 4:
Operation 3. Measure Photo-Current (linear gain) in pixels of Row "N":
H—Pre-select the ADC and digital counter in each column to operate in the voltage-to-time mode,
I—Select Row "N" (turn ON all RSTs in Row "N"),
J—Apply suitable voltage to APD for measuring photo-current:
K—Apply negative potential at the top electrode (shared by all APDs), The pixels with RSTs turned OFF have an applied voltage whose magnitude is equal or less than the magnitude of this negative potential, which is not enough to provide avalanche conditions,
L—Apply positive potential at the column readout line, The APDs in the pixels with RSTs turned OFF are not affected by this positive potential,
M—The APDs in pixels with RSTs turned ON, are under a total applied voltage that is the sum of the negative and positive potentials, which is chosen for its suitability to measure photo-current with large linear avalanche gain,
N—Measure photo-current with column ADC working in the voltage-to-time mode,
O—Move data from counters to row "N" of "Second-Table",
Operation 4. Edge/Pulse Detection (Geiger mode) in pixels of Row "N":
P—Set APDs of Row "N" and ADC to operate in the "Edge/Pulse Detection" mode,
Q—Apply negative potential common terminal of all APDs, R—Apply positive potential at the column line such that the voltage across the APDs of Row "N" is suitable for Geiger mode,
—Simultaneously do:
S—Emit light pulse in the suitable range of wavelengths,
T—Begin counting time using column "digital counter",
U—Detection current step or pulse coming from APD, and stopping of column "digital counter";
V—Move data from counters to row "N" of "Third-Table",
W—De-selection of Row "N",
X—Repeat Operation 2 and 4 for subsequent rows, and
Y—Merge data from "First-Table", "Second-Table" and "Third-Table", into a new table with a suitable format.

15. Method of image formation, comprising the following steps A through ZA, grouped into 4 principal phases and 4 mains operations:
First Phase—"Accumulation of Charges"
Operation 1. Accumulate Charges in pixels for all Rows of a pixel matrix
A—Define "Electronic Global Shutter" window (integration time),
B—All rows are de-selected (all RSTs are OFF),
C—Apply negative voltage pulse at the common top electrode of Avalanche Photo-Diodes (APDs), The pulse width (duration of the pulse) defines the shutter window,
D—Repeat operation 1 for subsequent rows, Second Phase—Readout of "Accumulated Charges" for all Rows Operation 2. Readout of Accumulate Charges in pixels for all: Rows of the pixel matrix E—Pre-select the ADC and digital counter in each column to operate in a charge-to-frequency mode, and define also the time interval available for readout, F—Select Row "N" (turn ON all RSTs in Row "N"), begin interaction between "charge reservoirs" and "ADC+ Counter", G—At the end of the pre-defined readout time, move data from counters to row "N" of "First-Table", H—Repeat operation 2 for subsequent rows, Third Phase—Measurement of Photo-Current (Linear Gain)

Operation 3. Measure Photo-Current (linear gain) in pixels of Row "N":

I—Pre-select the ADC and digital counter in each column to operate in the voltage-to-time mode, J—Select Row "N" (turn ON all RSTs in Row "N"), K—Apply suitable voltage to APD for measuring photo-current, L—Apply negative potential at the top electrode (shared by all APDs), The pixels with RSTs turned OFF have an applied voltage whose magnitude is equal or less than the magnitude of this negative potential, which is not enough to provide avalanche conditions, M—Apply positive potential at the column readout line, The APDs in the pixels with RSTs turned OFF are not affected by this positive potential, N—The APDs in pixels with RSTs turned ON, are under a total applied voltage that is the sum of the negative and positive potentials, which is chosen for its suitability to measure photo-current with large linear avalanche gain, O—Measure photo-current with column ADC working in the voltage-to-time mode, P—Move data from counters to row "N" of "Second-Table", Q—Repeat operation 3 for subsequent rows in turn, Fourth Phase—Edge/Pulse Detection (Geiger mode)

Operation 4. Edge/Pulse Detection (Geiger mode) in pixels of Row "N":

R—Set APDs of Row "N" and ADC to operate in the "Edge/Pulse Detection" mode,

S—Apply negative potential on top (common) terminal of all APDs, T—Apply positive potential at the column line such that the voltage across the APDs of Row "N" is suitable for Geiger mode, —Simultaneously do:

U—Emit light pulse in the suitable range of wavelengths, V—Begin counting time using column "digital counter", W—Detection current step or pulse coming from APD, and stopping of column "digital counter", X—Move data from counters to row "N" of "Third-Table", Y—De-selection of Row "N", Z—Repeat operation 4 for subsequent rows in turn, and ZA—Merge data from "First-Table", "Second-Table" and "Third-Table", into a new table with a suitable format.

16. Method of image formation, comprising the following steps A through G, grouped into 2 principal phases:

First Phase—"Accumulation of Charges"

A—Light is absorbed in all pixels all the time (shutterless)

B—All rows are de-selected (all RSTs are OFF),

C—Apply constant negative potential to top electrode of Avalanche Photo-Diodes (APDs) (shared by all APDs)

Second Phase—Readout of Row "N"

D—Pre-select "Column ADC" to operate The time interval available for readout ("Readout Window") is suitable to subtract only one "packet of charges" from a pixel, E—Turn ON all RSTs in Row "N", and begin interaction between pixels of Row "N", and "column ADCs", F—At the end of the "Readout Window", move data from counters to a Table named "Sub-Frame$_{13}$ M", G—Repeat Readout Sequence of Row "N" for all Rows.

* * * * *